(12) United States Patent
Stockstad et al.

(10) Patent No.: US 7,962,109 B1
(45) Date of Patent: Jun. 14, 2011

(54) EXCESS CURRENT AND SATURATION DETECTION AND CORRECTION IN A POWER AMPLIFIER

(75) Inventors: Troy Stockstad, Chandler, AZ (US);
Alexander Wayne Hietala, Phoenix, AZ (US); Fares Jaoude, Tucson, AZ (US); Roman Zbigniew Arkiszewski, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 774 days.

(21) Appl. No.: 11/679,201

(22) Filed: Feb. 27, 2007

(51) Int. Cl.
*H04B 17/00* (2006.01)

(52) U.S. Cl. ............. 455/115.1; 455/127.1; 455/226.1

(58) Field of Classification Search ........... 455/115.1–5, 455/127.1–5, 123, 151.1, 223, 232, 226, 455/522

See application file for complete search history.

(56) References Cited

U.S. PATENT DOCUMENTS

| | | | |
|---|---|---|---|
| 4,937,528 A | 6/1990 | Palanisamy | |
| 5,001,620 A * | 3/1991 | Smith | 363/89 |
| 5,239,255 A * | 8/1993 | Schanin et al. | 323/237 |
| 5,245,297 A * | 9/1993 | Claydon et al. | 330/129 |
| 5,278,994 A | 1/1994 | Black et al. | |
| 5,281,920 A | 1/1994 | Wurst | |
| 5,302,944 A * | 4/1994 | Curtis | 340/653 |
| 5,406,267 A * | 4/1995 | Curtis | 340/653 |
| 5,568,801 A * | 10/1996 | Paterson et al. | 123/598 |
| 5,583,420 A * | 12/1996 | Rice et al. | 322/25 |
| 5,659,240 A * | 8/1997 | King | 320/134 |
| 5,675,287 A | 10/1997 | Baker et al. | |
| 5,748,037 A | 5/1998 | Rozental et al. | |
| 5,751,217 A | 5/1998 | Kchao et al. | |
| 5,767,744 A * | 6/1998 | Irwin et al. | 330/297 |
| 5,808,445 A * | 9/1998 | Aylor et al. | 320/132 |
| 6,114,838 A | 9/2000 | Brink et al. | |
| 6,314,380 B1 * | 11/2001 | Seip et al. | 702/99 |
| 6,366,177 B1 | 4/2002 | McCune et al. | |
| 6,377,784 B2 | 4/2002 | McCune | |
| 6,384,608 B1 | 5/2002 | Namaky | |
| 6,405,062 B1 | 6/2002 | Izaki | |
| 6,476,677 B1 | 11/2002 | Komaili et al. | |
| 6,492,957 B2 * | 12/2002 | Carillo et al. | 343/841 |
| 6,534,996 B1 * | 3/2003 | Amrany et al. | 324/533 |
| 6,563,318 B2 | 5/2003 | Kawakami et al. | |

(Continued)

OTHER PUBLICATIONS

Notice of Allowability mailed Oct. 28, 2010 regarding U.S. Appl. No. 11/679,194.

(Continued)

*Primary Examiner* — Tony T Nguyen
(74) *Attorney, Agent, or Firm* — Withrow & Terranova, P.L.L.C.

(57) ABSTRACT

A system and method for detecting and correcting over-current and/or over-voltage conditions in power amplifier circuitry in a transmit chain of a mobile terminal are provided. In general, over-current detection and correction circuitry combines a current detection signal indicative of a current provided to or drained by the power amplifier circuitry during ramp-up for a transmit burst and a substantially inverse current ramping profile to provide a first constant value. The first constant value is compared to a current threshold or limit value to determine whether an over-current condition exists. If an over-current condition exists, the over-current detection and correction circuitry operates to reduce the output power of the power amplifier circuitry during ramp-up for the transmit burst to correct for the over-current condition. In a similar manner, over-voltage detection circuitry operates to detect and correct over-voltage conditions during ramp-up for the transmit burst.

24 Claims, 21 Drawing Sheets

U.S. PATENT DOCUMENTS

| | | | |
|---|---|---|---|
| 6,639,386 B2 | 10/2003 | Shiojima | |
| 6,808,781 B2* | 10/2004 | Mule'Stagno et al. | 428/64.1 |
| 6,882,130 B2* | 4/2005 | Handa et al. | 320/135 |
| 6,897,084 B2* | 5/2005 | Binns et al. | 438/58 |
| 6,950,683 B2 | 9/2005 | Hunt | |
| 7,010,276 B2 | 3/2006 | Sander et al. | |
| 7,078,966 B2* | 7/2006 | Khlat et al. | 330/129 |
| 7,135,351 B2* | 11/2006 | Binns et al. | 438/58 |
| 7,158,494 B2 | 1/2007 | Sander et al. | |
| 7,177,370 B2* | 2/2007 | Zhang et al. | 375/297 |
| 7,201,800 B2* | 4/2007 | Mule'Stagno et al. | 117/20 |
| 7,340,235 B1 | 3/2008 | Madsen et al. | |
| 7,450,916 B1* | 11/2008 | Hietala et al. | 455/127.2 |
| 7,502,601 B2* | 3/2009 | Dupuis | 455/127.2 |
| 7,557,653 B2* | 7/2009 | Camuffo et al. | 330/129 |
| 7,649,347 B2* | 1/2010 | Bickel | 324/100 |
| 7,688,136 B2* | 3/2010 | Langer et al. | 330/129 |
| 2002/0179006 A1* | 12/2002 | Borgini et al. | 117/95 |
| 2003/0054641 A1* | 3/2003 | Binns et al. | 438/689 |
| 2003/0136961 A1* | 7/2003 | Mule'Stagno et al. | 257/49 |
| 2003/0192469 A1* | 10/2003 | Libbert et al. | 117/2 |
| 2004/0067740 A1* | 4/2004 | Handa et al. | 455/127.1 |
| 2005/0048247 A1* | 3/2005 | Mule'Stagno et al. | 428/64.1 |
| 2005/0093625 A1* | 5/2005 | Khlat et al. | 330/129 |
| 2005/0135502 A1* | 6/2005 | Zhang et al. | 375/297 |
| 2005/0136865 A1* | 6/2005 | Dupuis | 455/127.1 |
| 2005/0158969 A1* | 7/2005 | Binns et al. | 438/471 |
| 2005/0206447 A1 | 9/2005 | Yamazaki et al. | |
| 2005/0206455 A1* | 9/2005 | Yamazaki et al. | 330/285 |
| 2006/0075960 A1* | 4/2006 | Borgini et al. | 117/200 |
| 2006/0082375 A1 | 4/2006 | Coates | |
| 2006/0164063 A1* | 7/2006 | Solheim et al. | 324/76.14 |
| 2007/0170909 A1* | 7/2007 | Vorenkamp et al. | 324/76.11 |
| 2007/0174527 A1* | 7/2007 | Vorenkamp | 710/100 |
| 2007/0279038 A1* | 12/2007 | Takada et al. | 324/76.25 |
| 2008/0106425 A1* | 5/2008 | Deaver et al. | 340/646 |
| 2008/0113635 A1 | 5/2008 | Camuffo et al. | |
| 2008/0186092 A1* | 8/2008 | Camuffo et al. | 330/69 |
| 2008/0197912 A1* | 8/2008 | Pannwitz | 327/539 |
| 2008/0204954 A1* | 8/2008 | Bickel | 361/86 |
| 2009/0128233 A1* | 5/2009 | Camuffo et al. | 330/69 |
| 2009/0224748 A1* | 9/2009 | Mignard et al. | 324/76.11 |
| 2009/0289678 A1* | 11/2009 | Pratt et al. | 327/170 |
| 2010/0108567 A1* | 5/2010 | Medoff | 208/49 |

OTHER PUBLICATIONS

Final Office Action mailed Jul. 9, 2010 regarding U.S. Appl. No. 11/679,194.

Nonfinal Office Action mailed Dec. 9, 2009 regarding U.S. Appl. No. 11/679,194.

Requirement for Restriction/Election mailed Jun. 25, 2009 regarding U.S. Appl. No. 11/679,194.

Notice of Allowance mailed Dec. 23, 2010 from U.S. Appl. No. 11/679,199.

Notice of Allowance mailed Oct. 28, 2010 from U.S. Appl. No. 11/679,199.

Notice of Allowance mailed Jul. 9, 2010 from U.S. Appl. No. 11/679,199.

Notice of Allowance mailed Jun. 7, 2010 from U.S. Appl. No. 11/679,199.

Non-final rejection mailed Nov. 16, 2009 from U.S. Appl. No. 11/679,199.

Restriction Requirement mailed Aug. 19, 2009 from U.S. Appl. No. 11/679,199.

Notice of Allowance mailed Oct. 1, 2010 from U.S. Appl. No. 12/873,968.

Notice of Allowance mailed Jan. 25, 2011 from U.S. Appl. No. 12/873,968.

* cited by examiner

EXCESS CURRENT AND SATURATION DETECTION AND CORRECTION IN A POWER AMPLIFIER

RELATED APPLICATIONS

The present application is related to U.S. patent application Ser. No. 11/099,936, entitled EXCESS CURRENT AND SATURATION DETECTION AND CORRECTION IN A POWER AMPLIFIER, which was filed on Apr. 6, 2005 and is hereby incorporated herein by reference in its entirety. The present application is also related to concurrently filed U.S. patent application Ser. No. 11/679,194, entitled OVER-VOLTAGE PROTECTION ACCOUNTING FOR BATTERY DROOP and U.S. patent application Ser. No. 11/679,199, entitled UTILIZING COMPUTED BATTERY RESISTANCE AS A BATTERY-LIFE INDICATOR IN A MOBILE TERMINAL, both of which are hereby incorporated by reference in their entireties.

FIELD OF THE INVENTION

The present invention relates to a transmitter for a mobile terminal, and more particularly relates to a system for detecting and correcting over-voltage or saturation of a collector-controlled power amplifier in a transmit chain of a mobile terminal.

BACKGROUND OF THE INVENTION

Battery-life and Output Radio Frequency Spectrum (ORFS) are two important criteria for determining the performance of a mobile terminal, such as a mobile telephone or the like. Both battery-life and ORFS may be adversely affected by a varying Voltage Standing Wave Ratio (VSWR) at the output of a power amplifier in the transmit chain of the mobile terminal. The VSWR may vary due to environmental factors such as the user placing an antenna of the mobile terminal near his or her body. As a result of the varying VSWR, the load impedance seen at the antenna also varies from an ideal load, such as 50 ohms.

For a power amplifier having output power controlled by controlling a supply voltage provided to the power amplifier, when the load impedance is less than the ideal load impedance, the output current of the power amplifier increases, thereby creating an excessive current drain on a battery powering the mobile terminal and decreasing battery-life. When the load impedance is more than the ideal load impedance, the output current of the power amplifier decreases, thereby requiring a greater supply voltage to provide the target output power. At some point, the load impedance may increase such that the supply voltage needed to provide the target output power is greater than the maximum voltage that can possibly be provided by the battery of the mobile terminal. If this occurs during ramp-up for a transmit burst, spectral noise will be generated in the output of the power amplifier when the maximum possible voltage level is achieved and a further increase is clipped. In addition, if the supply voltage is varied to provide amplitude modulation, the hard limit of the battery voltage will truncate the output waveform of the power amplifier and cause severe distortion of the desired modulation pattern.

Accordingly, there is a need for a system and method for detecting and correcting over-voltage or saturation and over-current conditions in a collector-controlled power amplifier.

SUMMARY OF THE INVENTION

The present invention provides a system and method for detecting and correcting over-current and over-voltage conditions in power amplifier circuitry in a transmit chain of a mobile terminal. In general, over-current detection and correction circuitry combines a current detection signal indicative of a current provided to or drained by the power amplifier circuitry during ramp-up for a transmit burst and a substantially inverse current ramping profile to provide a first constant value. The first constant value is compared to a current threshold or limit value to determine whether an over-current condition exists. If an over-current condition exists, the over-current detection and correction circuitry operates to reduce a power control signal controlling a supply voltage provided to the power amplifier circuitry, thereby reducing the output power and thus the current drawn by the power amplifier circuitry in order to correct the over-current condition. In one embodiment, the process is repeated at multiple points during ramp-up for the transmit burst.

The system may also include over-voltage detection and correction circuitry that combines a signal indicative of a supply voltage provided to the power amplifier circuitry during ramp-up for a transmit burst and a substantially inverse voltage ramping profile to provide a second constant value. The second constant value is compared to a voltage threshold or limit value to determine whether an over-voltage condition exists. If an over-voltage condition exists, the over-voltage detection and correction circuitry operates to reduce the power control signal controlling the supply voltage provided to the power amplifier circuitry, thereby reducing the output power and correcting the over-voltage condition. In one embodiment, the process is repeated at multiple points during ramp-up for the transmit burst.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
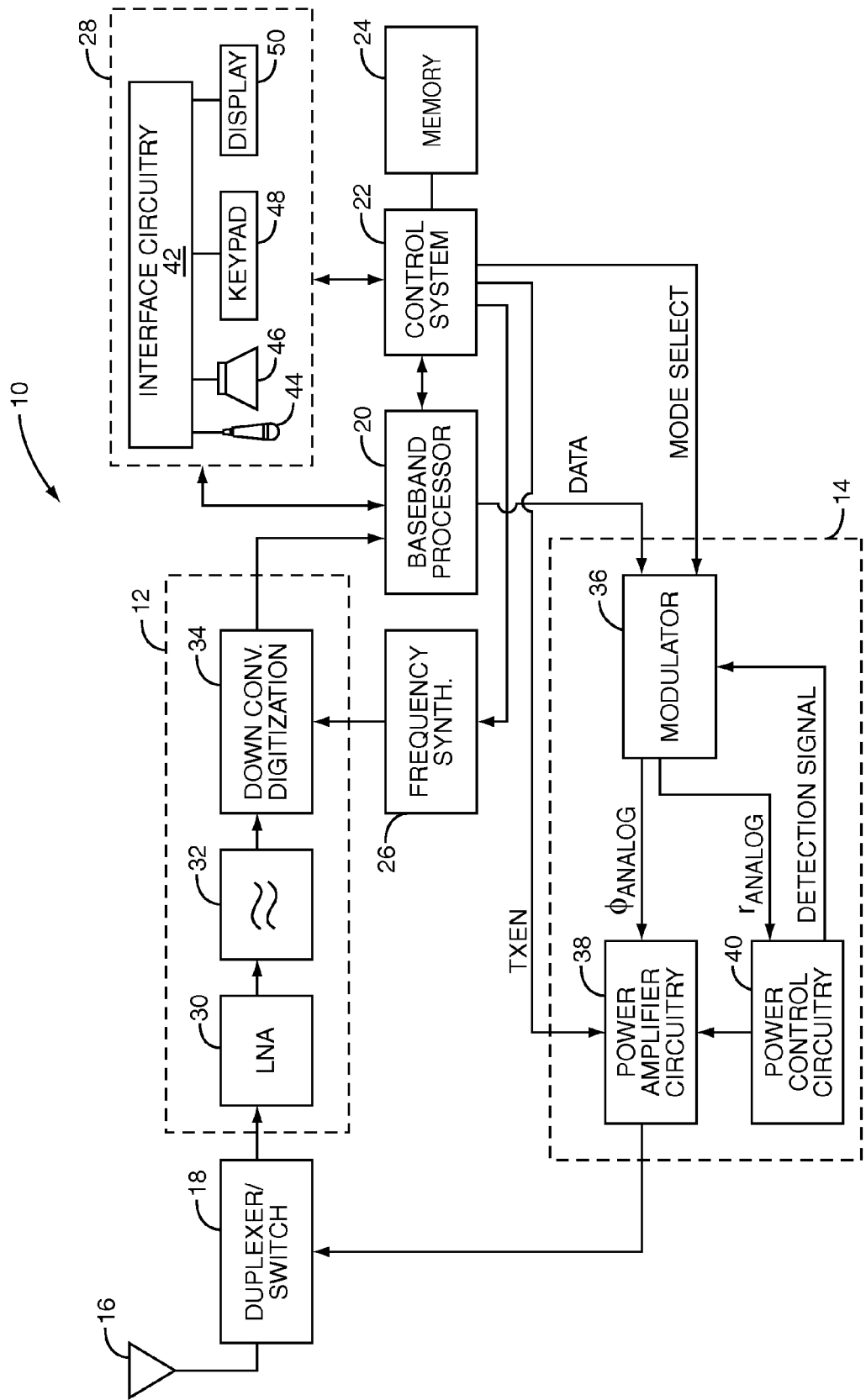
FIG. 1 illustrates an exemplary mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data (DATA) to the radio frequency transmitter section 14.

A modulator 36 receives the encoded data (DATA) from the baseband processor 20 and operates according to one or more modulation schemes to provide a modulated signal to power amplifier circuitry 38. The modulation scheme of the modulator 36 may be controlled by a mode select signal (MODE SELECT) from the control system 22. In one embodiment, the mobile terminal 10 operates according to the Global System for Mobile Communications (GSM) standards wherein the modulator 36 operates according to either an 8-Level Phase Shift Keying (8PSK) modulation scheme for Enhanced Data rates for GSM Evolution (EDGE) mode, which is a modulation scheme containing both amplitude and phase components, or a Gaussian Minimum Shift Keying (GMSK) modulation scheme, which is a constant amplitude modulation scheme.

When in 8PSK mode, the modulator 36 provides a phase component ($\phi_{ANALOG}$), or a phase modulation signal, at a desired transmit frequency to the power amplifier circuitry 38 and an amplitude component ($r_{ANALOG}$), or amplitude modulation signal, to power control circuitry 40. In 8PSK mode, the amplitude component ($r_{ANALOG}$) is a combination of an amplitude modulation component and preferably a ramping signal defining the transmit burst and optionally an output power level of the mobile terminal 10. The power control circuitry 40 controls an output power of the power amplifier circuitry 38 based on the amplitude component ($r_{ANALOG}$), thereby providing amplitude modulation of the phase component ($\phi_{ANALOG}$).

When in GMSK mode, the modulator 36 provides the phase modulation signal ($\phi_{ANALOG}$) at a desired transmit frequency to the power amplifier circuitry 38 and the amplitude component ($r_{ANALOG}$) to the power control circuitry 40. In GMSK mode, the amplitude component ($r_{ANALOG}$) is the ramping signal defining the transmit burst and optionally an output power level of the mobile terminal 10.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component ($r_{ANALOG}$).

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20 and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
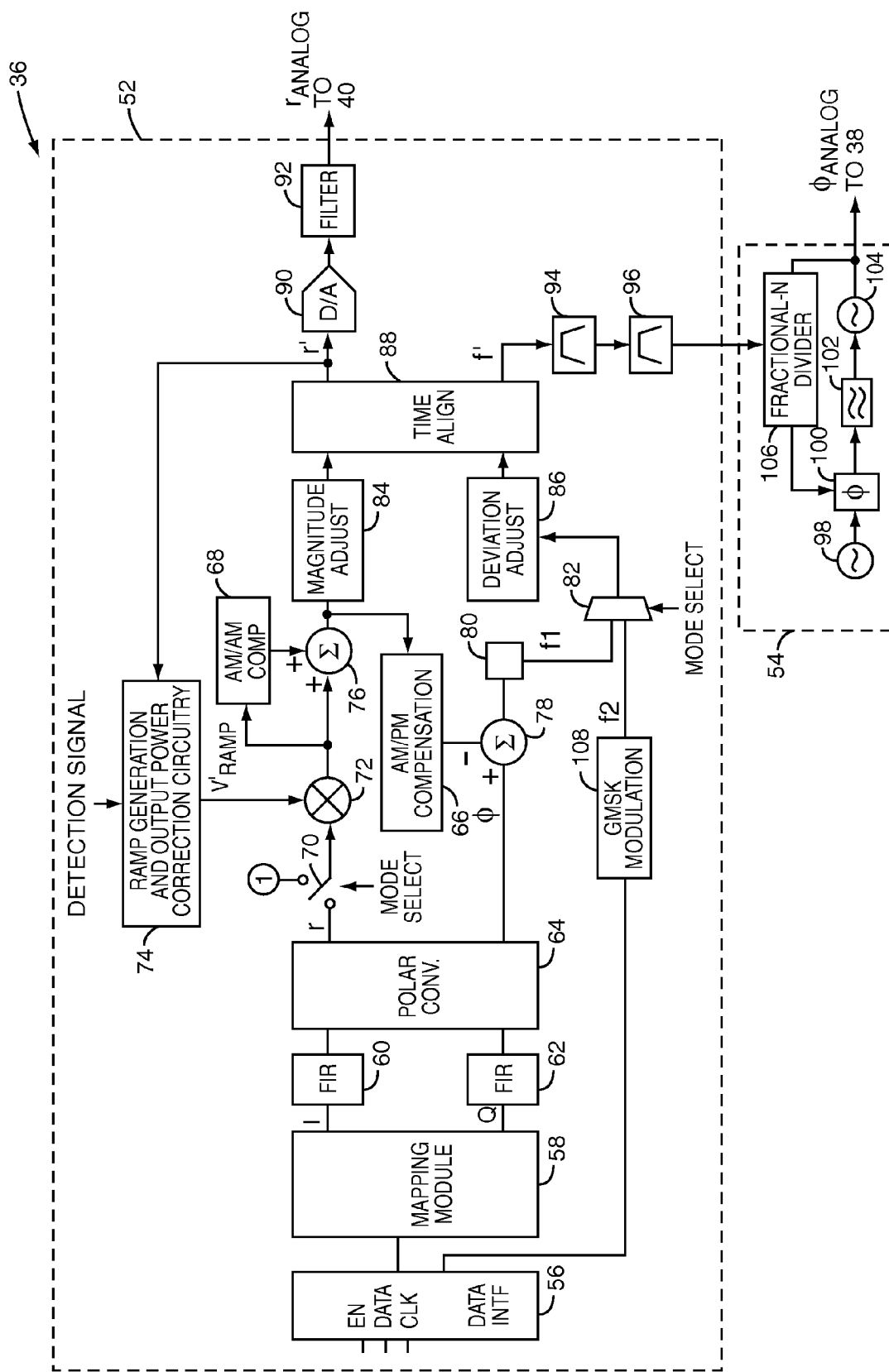
FIG. 2 illustrates an exemplary modulator including ramp generation and output power correction circuitry according to one embodiment of the present invention.

FIG. 2 illustrates an exemplary embodiment of the modulator 36, wherein the modulator 36 includes digital modulation circuitry 52 and a phase locked loop (PLL) 54. The modulator 36 operates in either an 8PSK or GMSK mode. It should be noted that 8PSK and GMSK are exemplary modulation schemes and are not intended to limit the scope of the present invention. The modulator 36 includes several components, including a data interface 56, a mapping module 58, first and second filters 60 and 62, and a polar converter 64. Other components of the modulator 36 will be discussed below. It should be noted that the data interface 56 may include First In First Out (FIFO) circuitry or may alternatively be a real time serial data interface.

The mapping module 58, the filters 60 and 62, and the polar converter 64 form an 8PSK modulator. As discussed below, in this embodiment, the 8PSK modulator also includes amplitude modulation to phase modulation (AM/PM) compensation circuitry 66, amplitude modulation to amplitude modulation (AM/AM) compensation circuitry 68, and various other components as described below.

When in 8PSK mode, the data interface 56 receives data from the baseband processor 20 (FIG. 1) at the bit rate of the system. This data is passed to the mapping module 58, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each symbol are then filtered by the first and second filters 60 and 62, respectively. In an exemplary embodiment, the first and second filters 60 and 62 are Enhanced Data Rates for GSM Evolution (EDGE) finite impulse response (FIR) filters. This, as dictated by the ETSI specifications, shapes the response between symbol times.

After filtering, both the in-phase (I) and the quadrature phase (Q) components are sent to the polar converter 64. The polar converter 64 uses a classical coordinate rotation digital computer (CORDIC) algorithm or like rectangular to polar conversion technique. Thus, the polar converter 64 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, February 22-24, pp. 191-200 and "The CORDIC Trigonometric Computing Technique" by Jack E. Volder, IRE Trans on Elect. Computers, p. 330, 1959, both of which are hereby incorporated by reference in their entireties.

Figure 21:
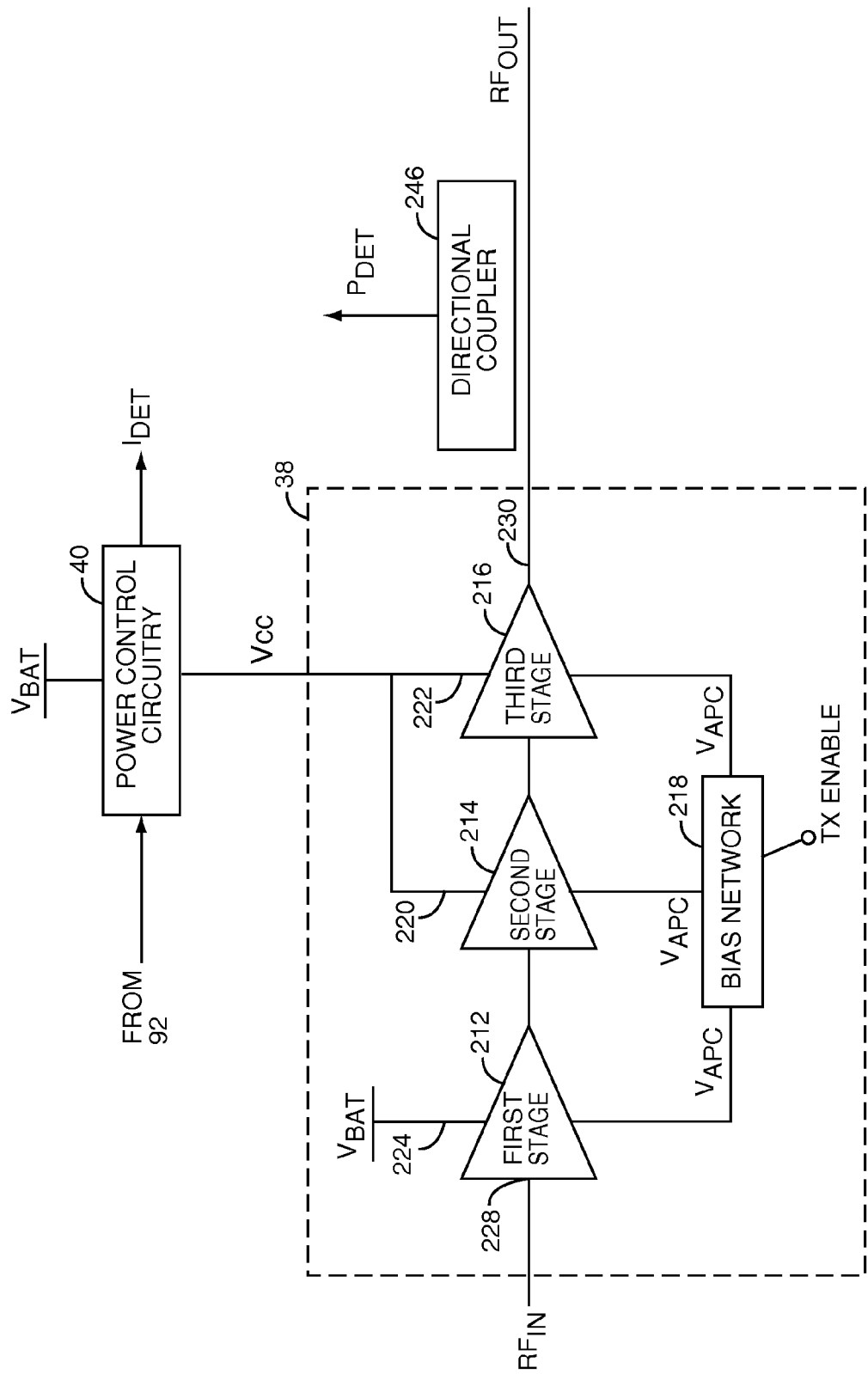
FIG. 21 illustrates an exemplary embodiment of a system for detecting the output power of a power amplifier using a directional coupler according to one embodiment of the present invention.

When in 8PSK mode, a switch 70 is controlled by the mode select signal (MODE SELECT) such that the amplitude signal (r) is provided to a multiplier 72. The multiplier 72 combines the amplitude signal (r) with a corrected ramping signal ($V'_{RAMP}$) generated by ramp generation and output power correction circuitry 74 to provide a composite amplitude signal. As discussed below in more detail, the ramp generation and output power correction circuitry 74 detects and corrects over-current conditions based on a detection signal (DETECTION SIGNAL) provided from either the power control circuitry 40 (FIG. 1) or a directional coupler 246 (FIG. 21). The ramp generation and output power correction circuitry 74 also detects and corrects over-voltage conditions based on, in one embodiment, digital amplitude modulation signal (r'). The digital amplitude modulation signal (r') is also referred to herein as a digital power control signal. In addition, the ramp generation and output power correction circuitry 74 may correct the output power of the power amplifier circuitry 38 (FIG. 1) based on the detection signal (DETECTION SIGNAL) such that the output power of the power amplifier circuitry 38 is essentially equal to the desired, or target, output power.

The composite amplitude signal from the multiplier 72 is directed to the AM/AM compensation circuitry 68 and summation circuitry 76. The AM/AM compensation circuitry 68 introduces a compensation term to the composite amplitude signal via the summation circuitry 76 that, after further processing, counteracts the distortion introduced by AM/AM conversion in the power amplifier circuitry 38. The compensated amplitude signal from the summation circuitry 76 is provided to the AM/PM compensation circuitry 66. The AM/PM compensation circuitry 66 introduces a compensation term to the phase signal ($\phi$) via subtraction circuitry 78 that, after further processing, counteracts the distortion introduced by AM/PM conversion in the power amplifier circuitry 38. Further details of the AM/PM compensation circuitry 66 and the AM/AM compensation circuitry 68 can be found in commonly owned and assigned U.S. Patent Application Publication No. 2003/0215025, entitled AM TO PM CORRECTION SYSTEM FOR POLAR MODULATOR, published Nov. 20, 2003; and U.S. Patent Application Publication No. 2003/0215026, entitled AM TO AM CORRECTION SYSTEM FOR POLAR MODULATOR, published Nov. 20, 2003, both of which are hereby incorporated by reference in their entireties.

The output of the subtraction circuitry 78, which is referred to herein as the compensated phase signal, is directed to a phase to frequency converter 80. The output of the phase to frequency converter 80 is a frequency signal (f1), which generally corresponds to the desired frequency deviation of the modulated signal. The frequency signal (f1) is provided to a multiplexer switch 82, which is controlled by the mode select signal (MODE SELECT). When in the 8PSK mode, the mode select signal (MODE SELECT) is provided such that the multiplexer switch 82 outputs the frequency signal (f1) from the phase to frequency converter 80.

Magnitude adjuster 84 and deviation adjuster 86 then adjust the magnitude of the compensated amplitude signal from the summation circuitry 76 and the frequency deviation of the frequency signal (f1), respectively, to a level expected by a time aligner 88, such that they comply with the appropriate standard. Next, a relative time delay is applied as necessary to the signals for best Error Vector Magnitude (EVM) and spectrum by the time aligner 88, such that the time aligner 88 provides a digital amplitude modulation signal (r') and a digital frequency signal (f'). The digital frequency signal (f') is a magnitude-adjusted, time-aligned version of the output of the multiplexer switch 82. Because these are preferably digital components, concerns about variations in analog components and the corresponding variation in time delays downstream are minimized.

At this point, the amplitude modulation signal (r') and the frequency signal (f') separate and proceed by different paths, an amplitude signal processing path and a frequency signal processing path, to the power amplifier circuitry 38. With respect to the amplitude signal processing path, when in the 8PSK mode, the amplitude modulation signal (r') is provided to a digital-to-analog (D/A) converter 90. The output of the D/A converter 90 is filtered by low-pass filter 92 to provide the analog amplitude component ($r_{ANALOG}$), which may also be referred to herein as an analog power control signal. In one embodiment, the D/A converter 90 is a sigma delta converter, and thus the output of the D/A converter 90 is a single Pulse Width Modulated (PWM) digital output signal having a carrier frequency, such as 78 MHz. The PWM digital output signal is then filtered by the low-pass filter 92 to remove the carrier frequency and provide the analog amplitude component ($r_{ANALOG}$) proportional to the PWM variation. The analog amplitude component ($r_{ANALOG}$) is used by the power control circuitry 40 to set the collector voltage on the power amplifier circuitry 38. As the analog amplitude component ($r_{ANALOG}$) changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f') from the time aligner 88 is directed to a digital filter 94 and a digital predistortion filter 96. The digital filter 94 is optional depending on the particular design. For more information regarding the digital predistortion filter 96, the interested reader is directed to U.S. Patent Application Publication No. 2006/0197613, entitled FREQUENCY MODULATION LINEARIZATION SYSTEM FOR A FRACTIONAL-N OFFSET PLL, published on Sep. 7, 2006 and U.S. Pat. No. 6,008,703, entitled DIGITAL COMPENSATION FOR WIDEBAND MODULATION OF A PHASE LOCKED LOOP FREQUENCY SYNTHESIZER, issued Dec. 28, 1999, both of which are hereby incorporated by reference in their entireties.

Thereafter, the filtered frequency signal, which is a digital signal, is provided to the phase locked loop (PLL) 54 to provide direct digital modulation similarly to that described in commonly owned and assigned U.S. Pat. No. 6,834,084, entitled DIRECT DIGITAL POLAR MODULATOR, issued Dec. 21, 2004, which is hereby incorporated herein by reference in its entirety. In one embodiment, the data interface 56 provides a digital data interface to the baseband processor 20 (FIG. 1), and the entire phase path from the data interface 56 to the PLL 54 is a digital path.

Based on the filtered frequency signal, the PLL 54 generates the analog phase modulation component ($\phi_{ANALOG}$) at the desired radio frequency. In the exemplary embodiment illustrated, the PLL 54 includes a reference oscillator 98, a phase detector 100, a loop filter 102, a voltage controlled oscillator (VCO) 104, and a fractional-N divider 106. The operational details of the PLL 54 will be apparent to one of ordinary skill in the art upon reading this disclosure. In general, the phase detector 100 compares a phase of a reference signal provided by the reference oscillator 98 with a divided signal provided by the fractional-N divider 106. Based on the comparison of the reference signal and the divided signal, the phase detector 100 provides a detection signal to the loop filter 102. The loop filter 102, which is a low pass filter, operates to filter the detection signal to provide a control signal to the VCO 104.

The PLL 54 illustrated in FIG. 2 is merely exemplary. In an alternative embodiment, the PLL 54 is the Fractional-N Offset PLL (FN-OPLL) described in commonly owned and assigned U.S. Pat. No. 7,098,754, entitled FRACTIONAL-N OFFSET PHASE LOCKED LOOP, which was issued on Aug. 29, 2006 and is hereby incorporated by reference in its entirety. In another embodiment, the PLL 54 may be like that disclosed in commonly owned and assigned U.S. patent application Ser. No. 11/070,704, entitled CLOSED LOOP POLAR MODULATION SYSTEM WITH OPEN LOOP OPTION AT LOW POWER LEVELS, which was filed on Mar. 2, 2005 and is hereby incorporated by reference in its entirety, such that the radio frequency transmitter section 14 may operate as either a closed loop polar modulator where the power amplifier circuitry 38 is enclosed within the loop of the PLL 54, or as an open loop polar modulator similar to that illustrated in FIG. 2.

When in GMSK mode, the switch 70 is controlled by the mode select signal (MODE SELECT) such that the multiplier 72 multiples the corrected ramping signal (V'$_{RAMP}$) by "1" rather than by the amplitude signal (r). The modulator 36 also includes a GMSK modulator, which includes GMSK modulation circuitry 108. The GMSK modulation circuitry 108 processes the data to generate a frequency signal (f2). In one embodiment, the GMSK modulation circuitry 108 is a look-up table. Another exemplary embodiment of the GMSK modulation circuitry 108 is discussed in U.S. Pat. No. 5,825,257, entitled GMSK MODULATOR FORMED OF PLL TO WHICH CONTINUOUS MODULATED SIGNAL IS APPLIED, issued Oct. 20, 1998, which is hereby incorporated by reference in its entirety. It should be appreciated that other embodiments of the GMSK modulation circuitry 108 may also be used, and the particular circuitry is not central to the present invention.

The output of the GMSK modulation circuitry 108, which is the frequency signal (f2), is provided to the multiplexer switch 82. In GMSK mode, the multiplexer switch 82 outputs the frequency signal (f2) from the GMSK modulation circuitry 108. As discussed above, the adjusters 84 and 86 then adjust the magnitude of the compensated amplitude signal and the deviation of the frequency signal (f2), respectively, to levels expected by the time aligner 88 such that they comply with the appropriate standard. Next, a relative time delay is applied as necessary to the signals for best Error Vector Magnitude (EVM) and spectrum by the time aligner 88.

At this point, the amplitude modulation signal (r') and the frequency signal (f') output by the time aligner 88 separate and proceed by different paths to the power amplifier circuitry 38. The amplitude modulation signal (r') is converted to analog by the digital-to-analog converter 90 and filtered by the low-pass filter 92 to provide the analog amplitude component ($r_{ANALOG}$), or analog power control signal. The analog amplitude component ($r_{ANALOG}$) is used by the power control circuitry 40 to set the collector voltage on the power amplifier circuitry 38.

As in 8PSK mode, when in GMSK mode, the frequency signal (f') from the time aligner 88 is directed to the optional digital filter 94, the digital predistortion filter 96, and the PLL 54. The PLL 54 generates the phase modulation signal at the desired radio frequency. In an exemplary embodiment, the frequency signal is applied to a single port on the fractional-N divider 106 within the PLL 54.

Figure 3:
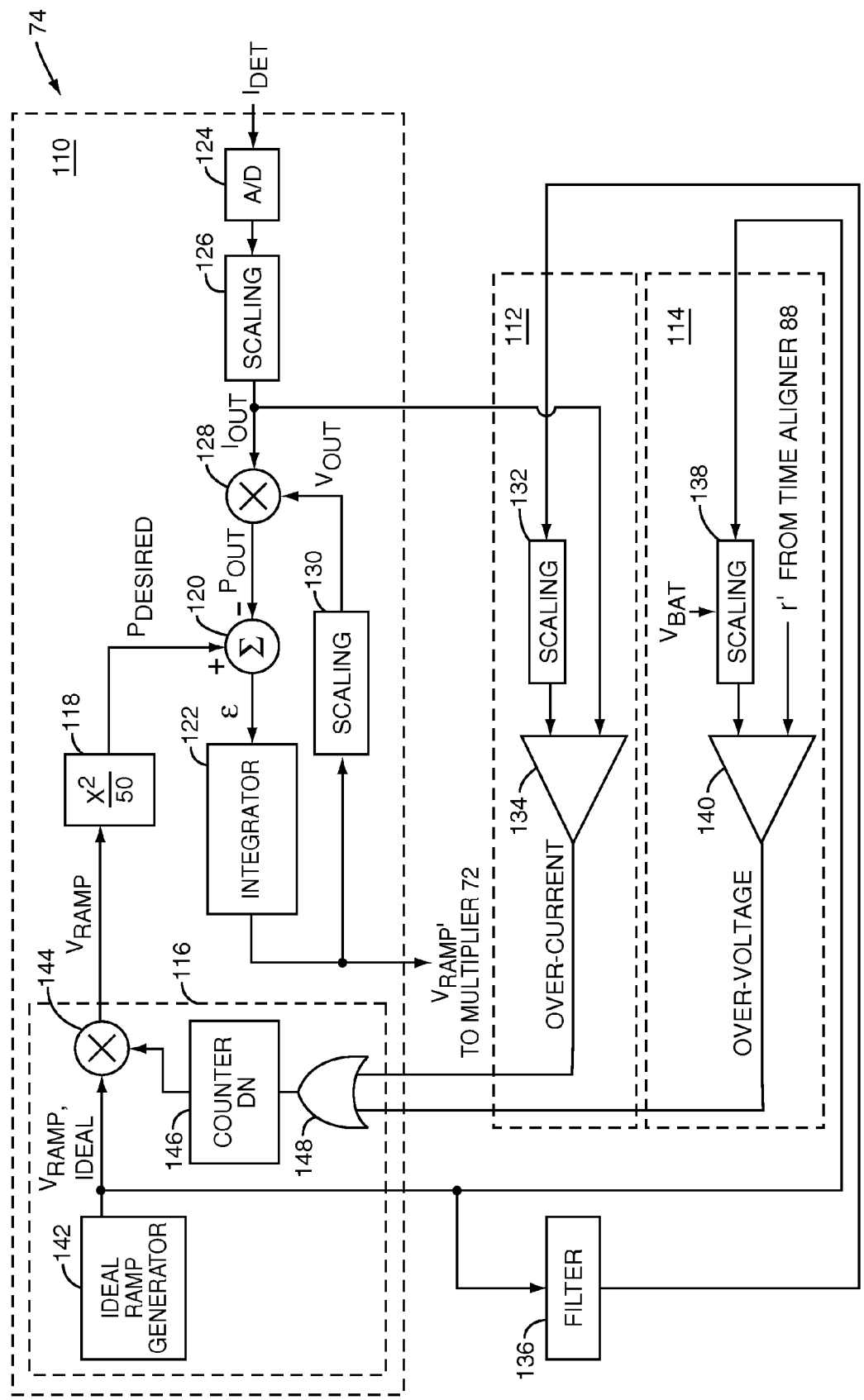
FIG. 3 illustrates the ramp generation and output power correction circuitry according to one embodiment of the present invention.

FIG. 3 illustrates the ramp generation and output power correction circuitry 74 according to one embodiment of the present invention. In general, the ramp generation and output power correction circuitry 74 includes output power correction circuitry 110, over-current detection and correction circuitry 112, and over-voltage detection and correction circuitry 114. In this embodiment, the output power correction circuitry 110, the over-current detection and correction circuitry 112, and the over-voltage detection and correction circuitry 114 operate during ramp-up for a transmit burst, and thereafter hold the corrected ramping signal ($V'_{RAMP}$) constant until ramp-down at the completion of the transmit burst. Further, in the preferred embodiment, the output power correction circuitry 110, the over-current detection and correction circuitry 112, and the over-voltage detection and correction circuitry 114 are all digital circuits.

The output power correction circuitry 110 operates to provide the corrected ramping signal ($V'_{RAMP}$) such that the output power of the power amplifier circuitry 38 (FIG. 1) is essentially equal to the target output power. This is beneficial because the load impedance, which is essentially the impedance seen at the antenna 16 (FIG. 1), may vary, thereby creating a varying Voltage Standing Wave Ratio (VSWR) at the output of the power amplifier circuitry 38. The output power correction circuitry 110 operates to provide the corrected ramping signal ($V'_{RAMP}$) such that the output power of the power amplifier circuitry 38 is essentially equal to the target output power regardless of variations in the load impedance.

Figure 4:
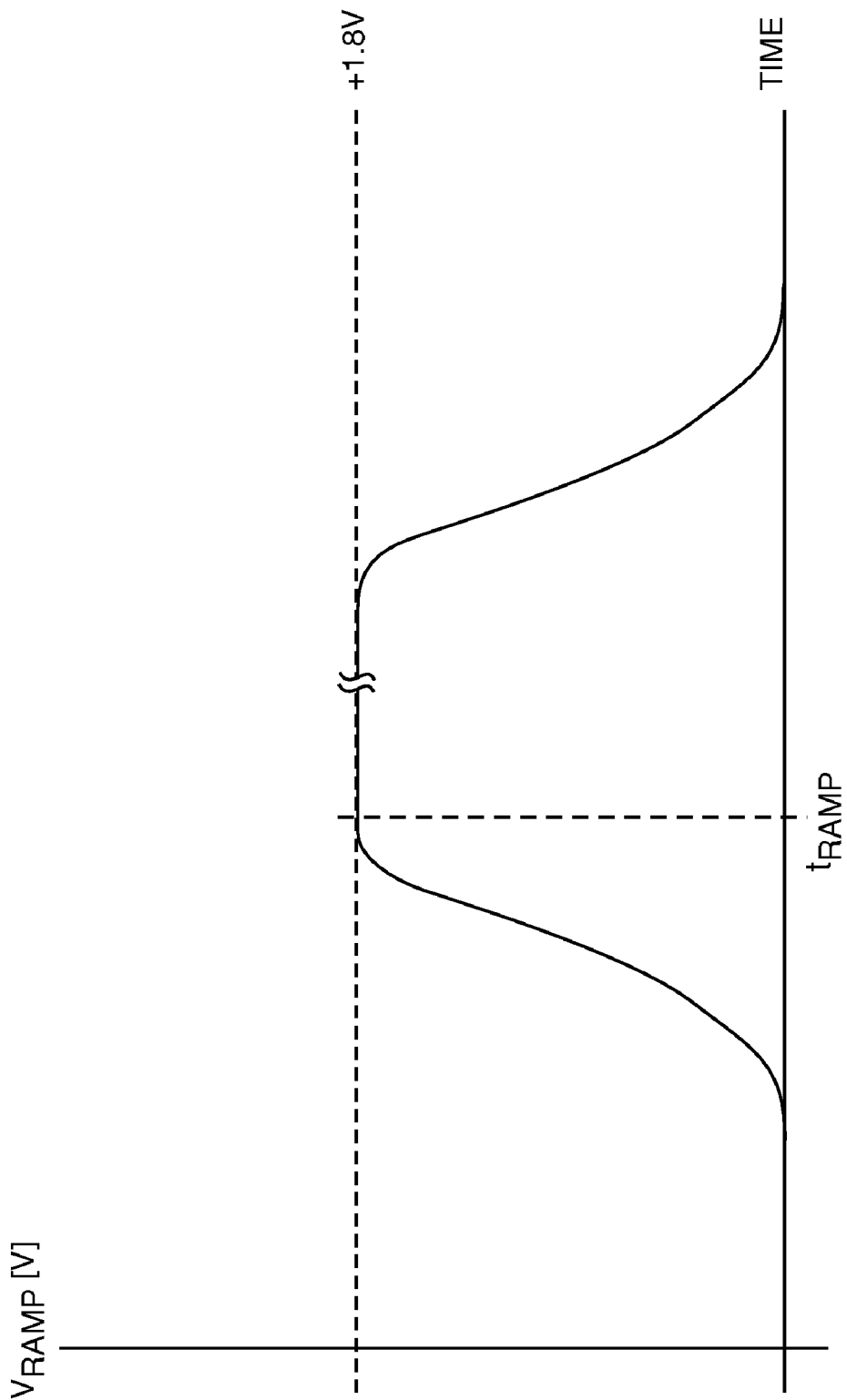
FIG. 4 is an exemplary illustration of a ramping signal ($V_{RAMP}$) for a transmit burst.

The output power correction circuitry 110 includes a power amplifier (PA) ramp generator 116 that provides an ideal ramping signal ($V_{RAMP,IDEAL}$) and a ramping signal ($V_{RAMP}$). The ramping signal ($V_{RAMP}$) is equivalent to the ideal ramping signal ($V_{RAMP,IDEAL}$) when no over-current or over-voltage condition exists. However, if an over-current or over-voltage condition is detected, the ramping signal ($V_{RAMP}$) may be reduced such that it is less than the ideal ramping signal ($V_{RAMP,IDEAL}$) An exemplary embodiment of the ramping signal ($V_{RAMP}$) is illustrated in FIG. 4, where $t_{RAMP}$ indicates the end of ramp-up for the transmit burst. Returning to FIG. 3, the PA ramp generator 116 provides the ramping signal ($V_{RAMP}$) based on an ideal load impedance, which may be 50 ohms. However, since the load impedance may vary, it may be desirable to correct the ramping signal ($V_{RAMP}$) such that the target output power is provided by the power amplifier circuitry 38 (FIG. 1), as described below.

The ramping signal ($V_{RAMP}$) is converted from a voltage to a desired output power signal ($P_{DESIRED}$) by conversion circuitry 118. The conversion circuitry 118 converts the ramping signal ($V_{RAMP}$) to the desired output power signal ($P_{DESIRED}$) based on the equation $X^2/50$, where 50 is the exemplary ideal load impedance. Subtraction circuitry 120, which may also be referred to as difference circuitry, subtracts an output power signal ($P_{OUT}$), which corresponds to the actual output power of the power amplifier circuitry 38 (FIG. 1), from the desired output power signal ($P_{DESIRED}$) to provide an error signal ($\epsilon$). An integrator 122 integrates the error signal ($\epsilon$) to provide the corrected ramping signal ($V'_{RAMP}$). By integrating the error signal ($\epsilon$), the output power correction circuitry 110 provides the corrected ramping signal ($V'_{RAMP}$) such that the corrected ramping signal ($V'_{RAMP}$) tracks the trajectory of the ramping signal ($V_{RAMP}$) but has a corrected magnitude to provide the target output power regardless of variations in the load impedance.

In this embodiment, the detection signal (DETECTION SIGNAL) (FIGS. 1 and 2) is a current detection signal ($I_{DET}$). The current detection signal ($I_{DET}$) is first converted from an analog signal to a digital signal by an analog-to-digital (A/D) converter 124. The digital current detection signal is scaled by scaling circuitry 126 to provide an output current signal ($I_{OUT}$) corresponding to the actual output current, or collector current, of the power amplifier circuitry 38 (FIG. 1). A multiplier 128 multiplies the output current signal ($I_{OUT}$) by an output voltage signal ($V_{OUT}$) to provide the output power signal ($P_{OUT}$) to the subtraction circuitry 120. The output voltage signal ($V_{OUT}$) corresponds to an output voltage of the power amplifier circuitry 38 (FIG. 1), and is provided by scaling circuitry 130. The scaling circuitry 130 operates to scale the corrected ramping signal ($V_{RAMP}$), which is indicative of the output voltage of the power amplifier circuitry 38 (FIG. 1), to provide the output voltage signal ($V_{OUT}$). In one embodiment, the scaling circuitries 126 and 130 operate to multiply their corresponding input signals by predetermined scaling factors to provide their corresponding output signals.

According to the present invention, the over-current detection and correction circuitry 112 operates to detect when the output current, or collector current, of the power amplifier circuitry 38 (FIG. 1) exceeds a threshold current and, in response, controls the PA ramp generator 116 to reduce the target output power. Before discussing the details of the over-current detection and correction circuitry 112, it may be beneficial to discuss the concept of over-current. As discussed above, the PA ramp generator 116 operates to provide the ramping signal ($V_{RAMP}$) based on the ideal load impedance. However, due to various factors such as environmental conditions, the load impedance may actually be less than the ideal load impedance. When the load impedance is less than the ideal load impedance, the output power correction circuitry 110 operates to modify the magnitude of the ramping signal ($V_{RAMP}$) to provide the corrected ramping signal ($V'_{RAMP}$) such that the supply voltage, or collector voltage, provided to the power amplifier circuitry 38 (FIG. 1) changes to achieve the target output power. However, as the load impedance falls further below the ideal load impedance, the output current of the power amplifier circuitry 38 (FIG. 1) continues to increase, thereby creating an excessive current drain on a battery powering the mobile terminal 10 and decreasing battery-life.

Figure 5A:
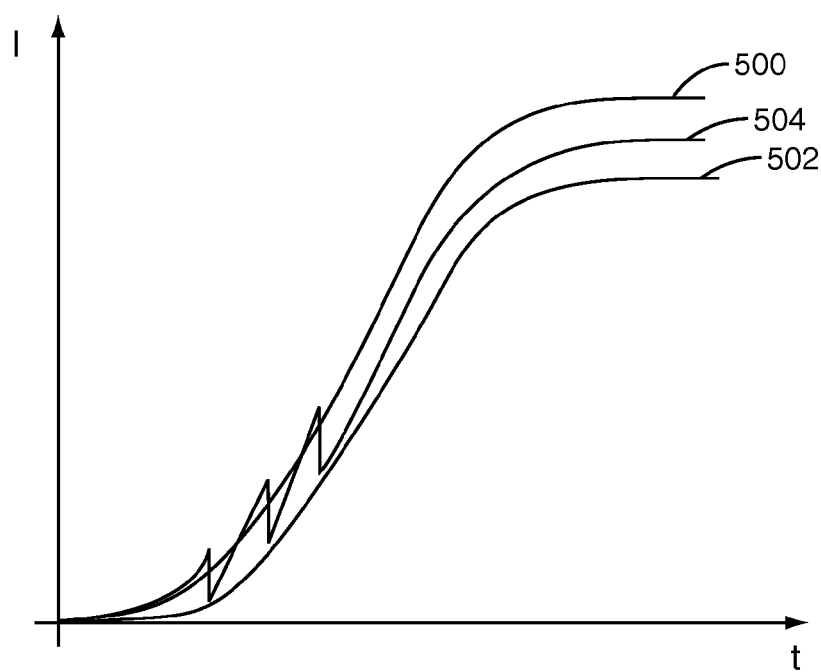
FIGS. 5A and 5B illustrate detection and correction of excess voltage or current according to one embodiment of the present invention.

The operation of the over-current detection and correction circuitry 112 is best described with respect to FIG. 5A. Note that the over-current detection and correction circuitry 112 operates only during ramp-up for a transmit burst. Based on the ideal ramping signal ($V_{RAMP,IDEAL}$), the over-current detection and correction circuitry 112 generates a maximum current ramp (line 500). An ideal current ramp (line 502) for the ideal load impedance is also illustrated. At numerous points in time during ramp-up, the over-current detection and correction circuitry 112 compares the detected output current ($I_{DET}$), which corresponds to a corrected, or actual, current ramp (line 504), to the maximum current ramp (line 500). If the detected output current ($I_{DET}$) exceeds the maximum current ramp (line 500), the over-current detection and correction circuitry 112 communicates with the PA ramp generator 116 (FIG. 3) to reduce the target output power by reducing the magnitude of the ramping signal ($V_{RAMP}$) with respect to the ideal ramping signal ($V_{RAMP,IDEAL}$) As a result, the detected output current ($I_{DET}$) (line 504) is also reduced. By operating only during ramp-up and correcting for over-current using multiple steps, the over-current detection and correction circuitry 112 ensures that any disturbances in the output radio frequency spectrum (ORFS) of the power amplifier circuitry 38 (FIG. 1) are small.

Returning to FIG. 3, the details of the over-current detection and correction circuitry 112 will now be described. The over-current detection and correction circuitry 112 includes scaling circuitry 132 and comparator 134. The scaling circuitry 132 provides the maximum current ramp (FIG. 5A, line 500) based on the ideal ramping signal ($V_{RAMP,IDEAL}$). More specifically, a low-pass filter 136, which is matched to the low-pass filter 92 (FIG. 2), filters the ideal ramping signal ($V_{RAMP,IDEAL}$) in order to compensate for the inherent delay of the low-pass filter 92. The scaling circuitry 132 provides the maximum current ramp (FIG. 5A, line 500) based on the filtered, ideal ramping signal ($V_{RAMP,IDEAL}$).

At numerous points in time during ramp-up, the comparator 134 compares the output of the scaling circuitry 132, which is the maximum current ramp, to the detected output current from the scaling circuitry 126. If the detected output current exceeds the maximum threshold current, the comparator 134 provides an over-current signal (OVER-CURRENT) to the PA ramp generator 116. In response, the PA ramp generator 116 reduces the target output power by reducing the magnitude of the ramping signal ($V_{RAMP}$) with respect to the magnitude of the ideal ramping signal ($V_{RAMP,IDEAL}$).

The over-voltage detection and correction circuitry 114 is similar to the over-current detection and correction circuitry 112. According to the present invention, the over-voltage detection and correction circuitry 114 operates to detect when the output voltage of the power amplifier circuitry 38 (FIG. 1) exceeds a threshold voltage. When the output voltage exceeds the threshold voltage, the over-voltage detection and correction circuitry 114 communicates with the PA ramp generator 116 to reduce the target output power. Before discussing the details of the over-voltage detection and correction circuitry 114, it may be beneficial to discuss the concept of over-voltage. As discussed above, the PA ramp generator 116 operates to provide the ramping signal ($V_{RAMP}$) based on the ideal load impedance. However, due to various factors such as environmental conditions, the load impedance may actually be more than the ideal load impedance. When the load impedance is more than the ideal load impedance, the output power correction circuitry 110 operates to modify the magnitude of the ramping signal ($V_{RAMP}$) to provide the corrected ramping signal ($V'_{RAMP}$) such that the supply voltage, or collector voltage, provided to the power amplifier circuitry 38 (FIG. 1) changes to achieve the target output power. However, as the load impedance increases further above the ideal load impedance, the output current of the power amplifier circuitry 38 (FIG. 1) continues to decrease, thereby requiring a greater collector voltage to provide the target output power. At some point, the collector voltage reaches a maximum voltage corresponding to the voltage of the battery powering the mobile terminal 10. If this were allowed to occur, a time discontinuity in the collector voltage would occur when the battery voltage level is reached thereby causing a spectral glitch. In addition, when operating in 8PSK mode where there is amplitude modulation, the hard limit of the battery voltage will truncate the output waveform of the power amplifier circuitry 38 (FIG. 1) if the collector voltage is allowed to sufficiently approach the battery voltage.

Figure 5B:
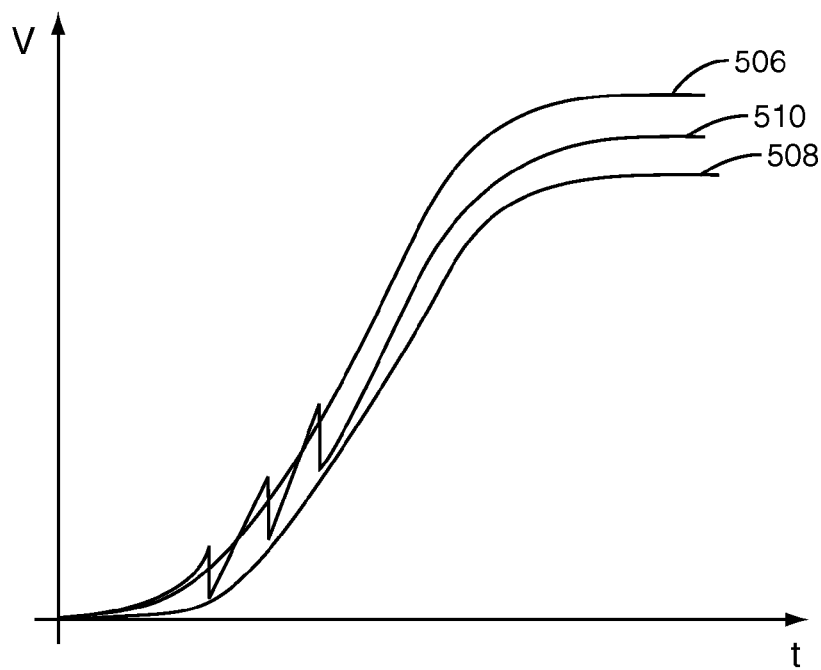

The operation of the over-voltage detection and correction circuitry 114 is best described with respect to FIG. 5B. Note that the over-voltage detection and correction circuitry 114 operates only during ramp-up for a transmit burst. Based on the ideal ramping signal ($V_{RAMP,IDEAL}$) and the measured battery voltage, the over-voltage detection and correction circuitry 114 generates a maximum voltage ramp (line 506). An ideal voltage ramp (line 508) for the ideal load impedance is also illustrated. At numerous points in time during ramp-up, the over-voltage detection and correction circuitry 114 compares the actual output voltage (line 510) to the maximum voltage ramp (line 506). If the output voltage (line 510) exceeds the maximum voltage ramp (line 506), the over-voltage detection and correction circuitry 114 communicates with the PA ramp generator 116 (FIG. 3) to reduce the target output power by reducing the magnitude of the ramping signal ($V_{RAMP}$) with respect to the ideal ramping signal ($V_{RAMP,IDEAL}$), thereby reducing the output voltage (line 510). By operating only during ramp-up and correcting for over-voltage using multiple steps, the over-voltage detection and correction circuitry 114 ensures that any disturbances in the output radio frequency spectrum (ORFS) of the power amplifier circuitry 38 (FIG. 1) are small.

Returning to FIG. 3, the details of the over-voltage detection and correction circuitry 114 will now be described. The over-voltage detection and correction circuitry 114 includes scaling circuitry 138 and comparator 140. The scaling circuitry 138 provides the maximum voltage ramp (FIG. 5B, line 506) based on the ideal ramping signal ($V_{RAMP,IDEAL}$) and a digital representation of the battery voltage ($V_{BAT}$). In one embodiment, the scaling circuitry 138 multiplies the digital representation of the battery voltage ($V_{BAT}$), the ideal ramping signal ($V_{RAMP,IDEAL}$), and a predetermined scaling factor to provide the maximum voltage ramp (FIG. 5B, line 506). The battery voltage ($V_{BAT}$) may be digitized by using the A/D converter 124 where the A/D converter 124 is shared between the current feedback and the battery voltage measurements. Alternatively, separate A/D converters may be used. Note that the scaling circuitry 138 provides the maximum voltage ramp (FIG. 5B, line 506) based on the ideal ramping signal ($V_{RAMP,IDEAL}$) rather than the output of the low-pass filter 136 because the comparator 140 compares the maximum voltage ramp to the amplitude signal (r'), where the amplitude modulation signal (r') has not been filtered by the low-pass filter 92 (FIG. 2). Accordingly, the low-pass filter 136 is not needed in this case to compensate for the inherent delay of the low-pass filter 92.

At numerous points in time during ramp-up, the comparator 140 compares the output of the scaling circuitry 138, which is the maximum voltage ramp, to the amplitude modulation signal (r'), which corresponds to the corrected, or actual, voltage ramp (FIG. 5B, line 510), from the time aligner 88 (FIG. 2). If the amplitude modulation signal (r') exceeds the maximum voltage ramp, the comparator 140 provides an over-voltage signal (OVER-VOLTAGE) to the PA ramp generator 116. In response, the PA ramp generator 116 reduces the target output power by reducing the magnitude of the ramping signal ($V_{RAMP}$) with respect to the magnitude of the ideal ramping signal ($V_{RAMP,IDEAL}$). The amplitude modulation signal (r') is one example of a signal indicative of the output voltage of the power amplifier circuitry 38 (FIG. 1), and is not intended to limit the scope of the present invention. Various alternatives for generating or acquiring a signal indicative of the output voltage of the power amplifier circuitry 38 (FIG. 1) will be apparent to one of ordinary skill in the art upon reading this disclosure.

FIG. 3 also illustrates an exemplary embodiment of the PA ramp generator 116. In this embodiment, the PA ramp generator 116 reduces the target output power by multiplying the ideal ramping signal ($V_{RAMP,IDEAL}$) by a correction factor that is less than one to provide the ramping signal ($V_{RAMP}$). For example, when the comparator 134 detects a first over-current condition or the comparator 140 detects a first over-voltage condition, the correction factor may be changed from an initial value, such as 1, to a first value, such as 0.95. Thereafter, if a second over-current or over-voltage condition is detected during ramp-up, the correction factor may be reduced to 0.9. This process may repeat several times during ramp-up. For the next transmit burst, the correction value is initially set to 1. The values for the correction factor may be selectable or hard-coded, depending on the particular implementation.

More specifically, in this embodiment, the PA ramp generator 116 includes an ideal ramp generator 142, a multiplier 144, a counter 146, and an OR gate 148. The ideal ramp generator 142 provides the ideal ramping signal ($V_{RAMP,IDEAL}$) based on the ideal load. The multiplier 144 multiplies the ideal ramping signal ($V_{RAMP,IDEAL}$) by a correction factor to provide the ramping signal ($V_{RAMP}$). The correction factor is provided by the counter 146 based on a combination of the over-current and over-voltage signals (OVER-CURRENT, OVER-VOLTAGE) provided by the OR gate 148. Prior to or at the beginning of ramp-up for a transmit burst, the correction factor is set to 1 by resetting the counter 146. During ramp-up, if either an over-current or over-voltage condition is detected, the OR gate 148 provides a down-count signal (DN) to the counter 146. In response, the counter decrements the correction factor by a predetermined value. The predetermined value may be selectable or hard-coded.

In another embodiment, the PA ramp generator 116 reduces the target output power by subtracting a predetermined value from the ideal ramping signal ($V_{RAMP,IDEAL}$) when either an over-current or an over-voltage condition is detected to provide the ramping signal ($V_{RAMP}$). The predetermined value may be selectable or hard-coded, depending on the particular implementation. Alternatively, the target output power may be reduced by subtracting a percentage of a difference between the two compared signals from the ideal ramping signal ($V_{RAMP,IDEAL}$) when either an over-current or an over-voltage condition is detected to provide the ramping signal ($V_{RAMP}$).

One issue with the ramp generation and output power correction circuitry 74 of FIG. 3 is that the latency of the power control circuitry 40 (FIG. 1), the D/A converter 90 (FIG. 2), and the A/D converter 124 cause the detected output power signal ($P_{OUT}$) to be delayed with respect to the desired output power signal ($P_{DESIRED}$). As a result, the power correction may be inaccurate.

Another issue with the ramp generation and output power correction circuitry 74 of FIG. 3 is that the integrator 122 tracks the trajectory of the ramping signal ($V_{RAMP}$). Thus, the output of the integrator 122 varies from zero to full-scale. In other words, the output of the integrator 122 is zero when the ramping signal ($V_{RAMP}$) is zero, and full-scale when the ramping signal ($V_{RAMP}$) is full-scale. As a result, the response time of the output power correction circuitry 110 may be relatively slow when compared to a ramp-up time of, for example, 8 microseconds.

Figure 6:
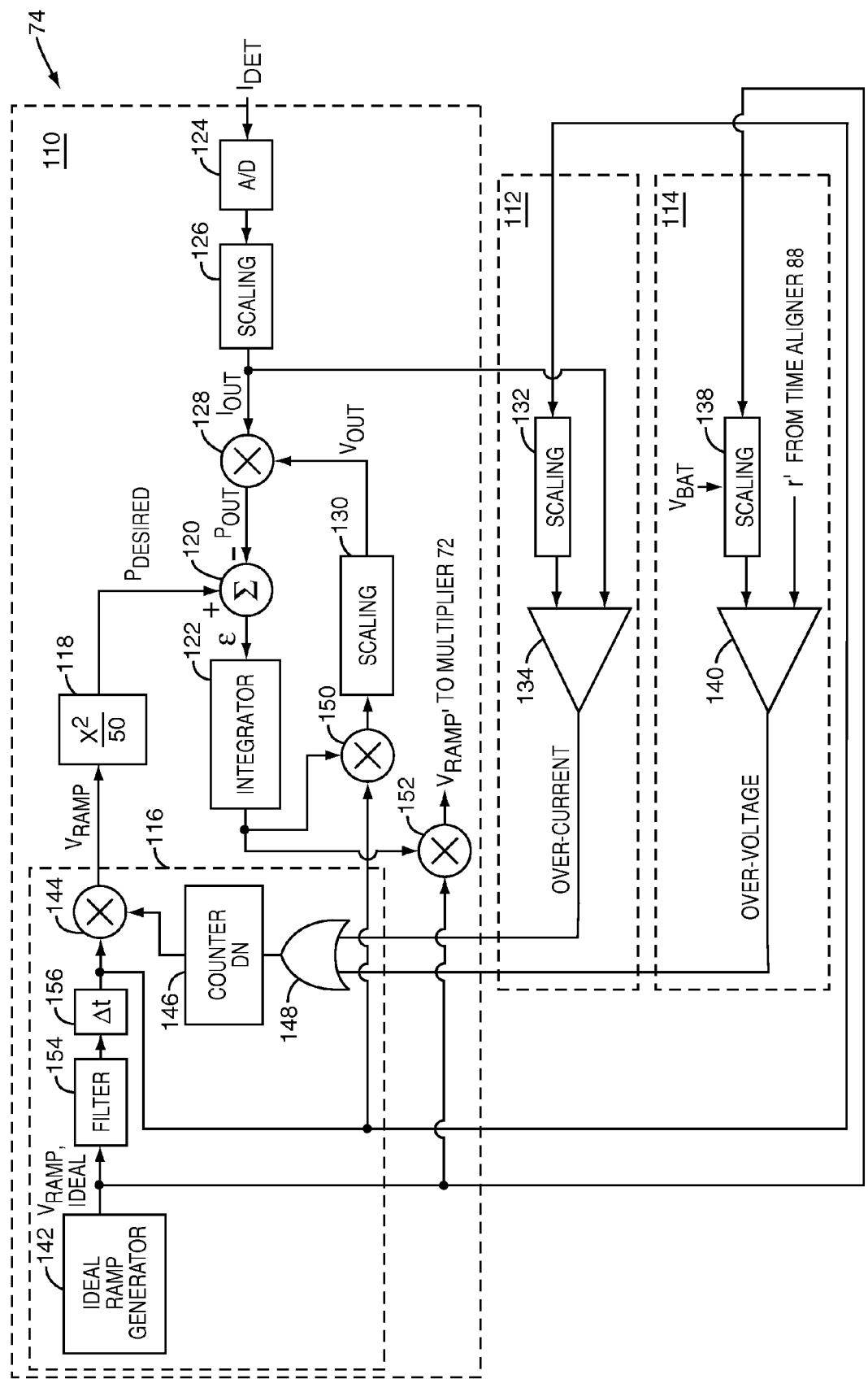
FIG. 6 illustrates the ramp generation and output power correction circuitry of FIG. 3 further including timing circuitry to correct for inherent delays.

FIG. 6 illustrates another embodiment of the ramp generation and output power correction circuitry 74, which is similar to the embodiment of FIG. 3, that resolves the two issues discussed above. In general, the ramp generation and output power correction circuitry 74 includes the output power correction circuitry 110, the over-current detection and correction circuitry 112, and the over-voltage detection and correction circuitry 114. However, in this embodiment, the output power correction circuitry 110 also includes filter 154 and delay (Δt) 156. As discussed above with respect to the low-pass filter 136 (FIG. 3), the filter 154 is a low-pass filter matched to the filter 92 (FIG. 2) in order to compensate for the inherent delay of the filter 92. The delay 156 operates to introduce a predetermined delay that compensates for the inherent delays of the D/A converter 90 (FIG. 2), the A/D converter 124, and the power control circuitry 40 (FIG. 1). By doing so, the desired power signal ($P_{DESIRED}$) is time aligned with the detected output power ($P_{OUT}$).

In addition, the output power correction circuitry 110 includes multipliers 150 and 152. Multipliers 150 and 152 may be generally referred to as combiners. The multiplier 150 operates to multiply the filtered, delayed ideal ramping signal ($V_{RAMP,IDEAL}$) from the output of the delay 156 and the output of the integrator 122 to provide a feedback signal to the scaling circuitry 130. The multiplier 152 operates to multiply the ideal ramping signal ($V_{RAMP,IDEAL}$) and the output of the integrator 122 to provide the corrected ramping signal ($V'_{RAMP}$). Note that the multiplier 152 operates based on the ideal ramping signal ($V_{RAMP,IDEAL}$), whereas the multiplier 150 operates based on the filtered, delayed ideal ramping signal ($V_{RAMP,IDEAL}$). This is because it is desirable to time align the output voltage ($V_{OUT}$) with the desired output power signal ($P_{DESIRED}$). As for the multiplier 152, it is not desirable to use the filtered, delayed ideal ramping signal ($V_{RAMP,IDEAL}$) because this would double the latency of the modulator 36 (FIG. 2). This is because the latency of the filter 154 and delay 156 corresponds to the latency of the filter 92 (FIG. 2), D/A converter 90 (FIG. 2), power control circuitry 40 (FIG. 1), and A/D converter 124 which already exist in the path between the corrected ramping signal ($V'_{RAMP}$) and multiplier 128.

As a result of the multipliers 150 and 152, the output of the integrator 122 tracks the error between $V_{RAMP,IDEAL}$ and the value of the corrected ramping signal ($V'_{RAMP}$) corresponding to the desired output power. In contrast, the integrator 122 of FIG. 3 tracks the entire trajectory of the ramping signal ($V_{RAMP}$) and varies from zero to full-scale. Accordingly, the response time of the output power correction circuitry 110 of FIG. 6 is substantially decreased as compared to the response time of the embodiment of FIG. 3.

Figure 7:
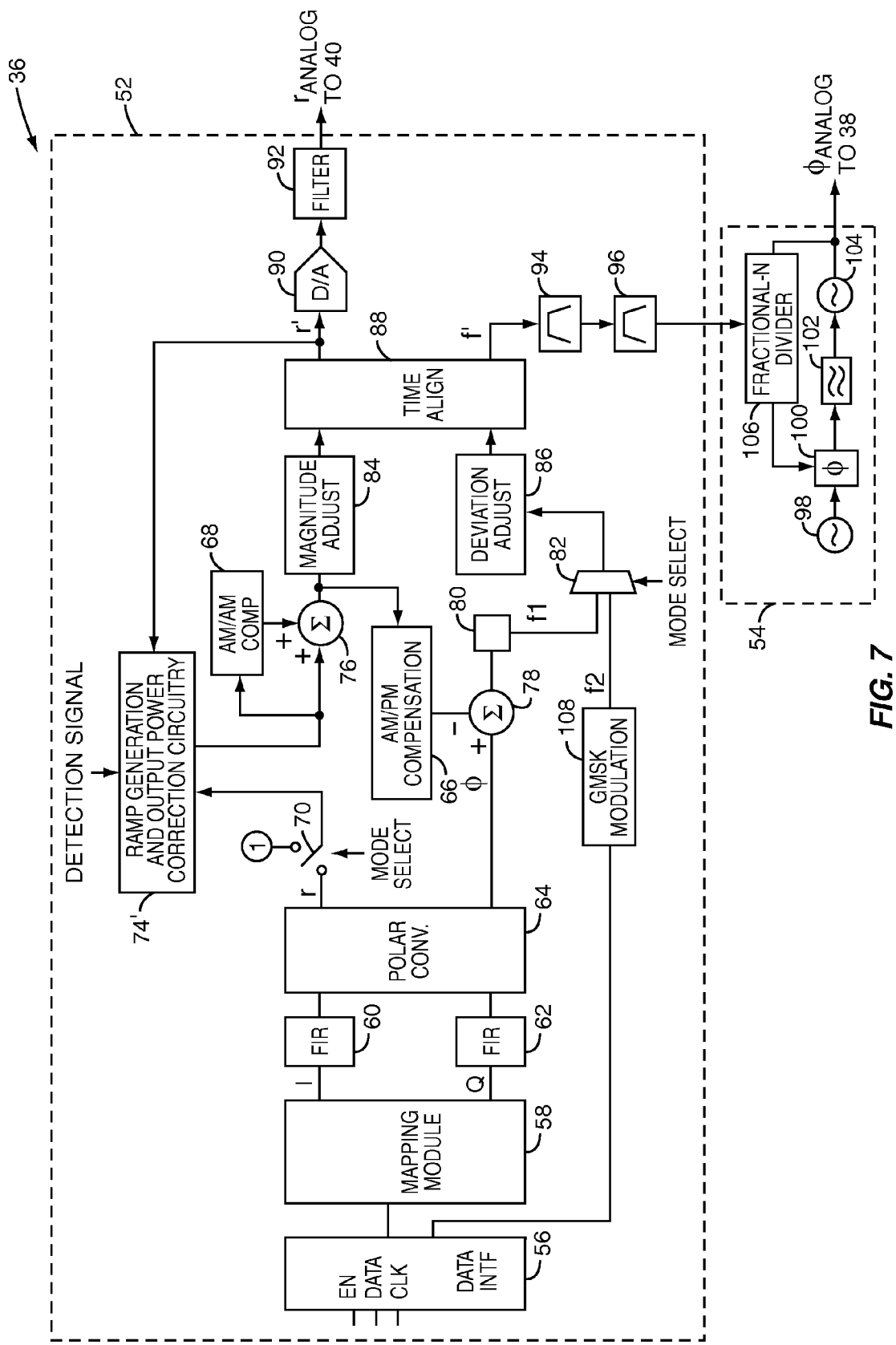
FIG. 7 illustrates another embodiment of the modulator of FIG. 1 according to another embodiment of the present invention.

FIG. 7 illustrates another embodiment of the modulator 36 similar to that shown in FIG. 2. Accordingly, the details of the modulator 36 discussed above with respect to FIG. 2 are equally applicable to the embodiment of FIG. 7. However, FIG. 7 illustrates an alternative embodiment of the ramp generation and output power correction circuitry 74' wherein the ramp generation and output power correction circuitry 74' operates during the entire transmit burst, rather than only during ramp-up. As illustrated, the ramp generation and output power correction circuitry 74' receives the output of the switch 70, which is referred to as the amplitude component. As discussed below in more detail, the ramp generation and output power correction circuitry 74' processes the amplitude component from the switch 70 to provide a corrected composite signal to the AM/AM compensation circuitry 68 and the summation circuitry 76.

Figure 8:
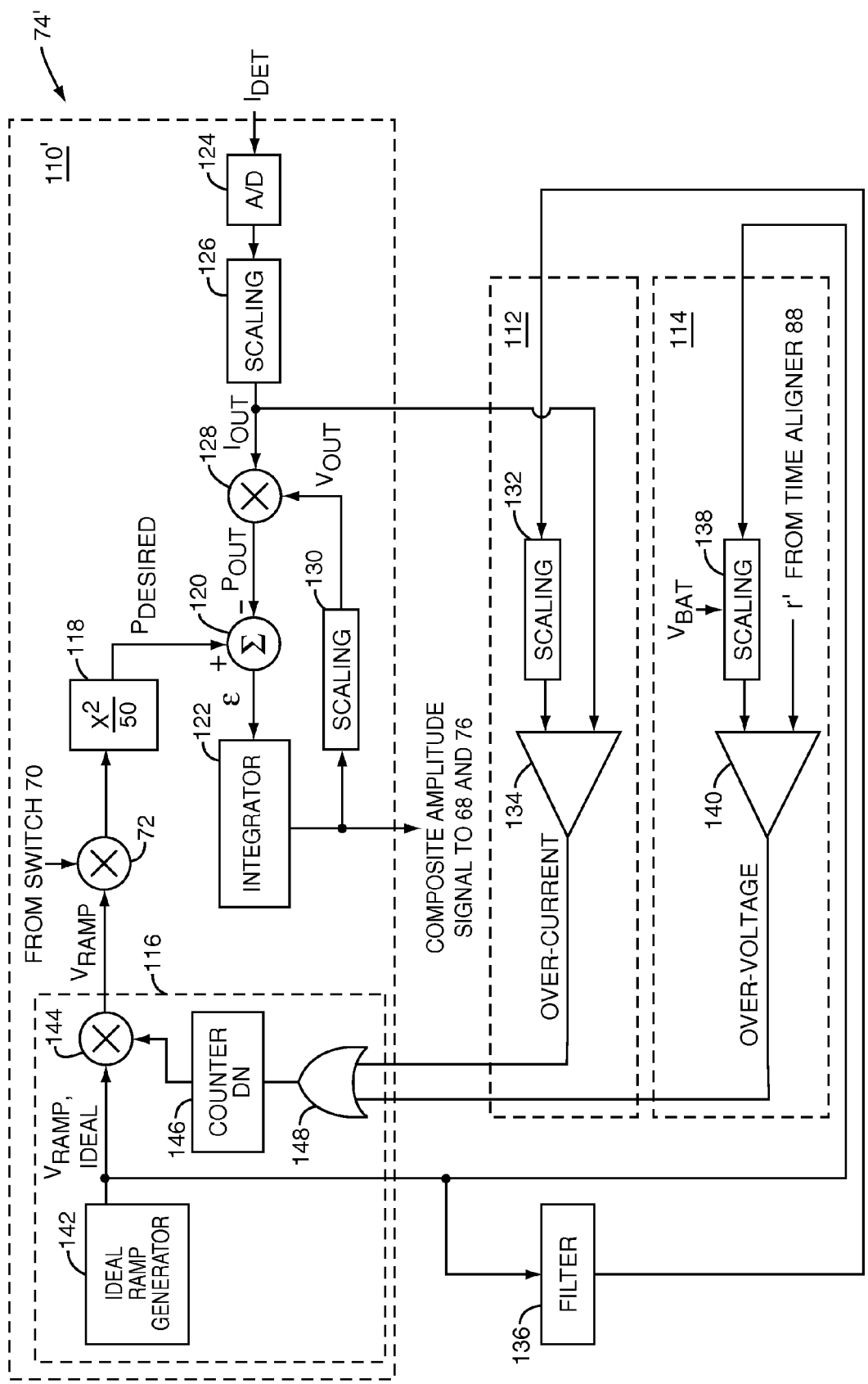
FIG. 8 illustrates the ramp generation and output power correction circuitry of FIG. 7 according to another embodiment of the present invention.

FIG. 8 is a detailed block diagram of one embodiment of the ramp generation and output power correction circuitry 74'. This embodiment operates substantially the same as the embodiment shown in FIG. 3. However, in this embodiment, the output power correction circuitry 110' operates during the entire transmit burst, rather than only during ramp-up as described above with respect to FIG. 3. More specifically, the multiplier 72 (FIG. 2) is included within the output power correction circuitry 110', and the output of the output power correction circuitry 110' is the corrected composite signal, which is provided to the AM/AM compensation circuitry 68 (FIG. 7) and the summation circuitry 76 (FIG. 7).

Accordingly, the output power correction circuitry 110' operates to provide the corrected composite signal such that the output power of the power amplifier circuitry 38 (FIG. 1) is essentially equal to the target output power. The power amplifier (PA) ramp generator 116 provides the ideal ramping signal ($V_{RAMP,IDEAL}$) and the ramping signal ($V_{RAMP}$). The ramping signal ($V_{RAMP}$) is equivalent to the ideal ramping signal ($V_{RAMP,IDEAL}$) when no over-current or over-voltage condition exists. However, if an over-current or over-voltage condition is detected, the ramping signal ($V_{RAMP}$) may be reduced such that it is less than the ideal ramping signal ($V_{RAMP,IDEAL}$). The multiplier 72 multiplies the ramping signal ($V_{RAMP}$) and the amplitude component (r) from the switch 70 (FIG. 7) to provide a composite signal. The composite signal is converted from a voltage to a desired output power signal ($P_{DESIRED}$) by conversion circuitry 118. From this point, the output power correction circuitry 110' operates as described above to provide the corrected composite signal.

As discussed above with respect to FIG. 3, one issue with the ramp generation and output power correction circuitry 74' of FIG. 8 is that the latency of the power control circuitry 40 (FIG. 1), the D/A converter 90 (FIG. 2), and the A/D converter 124 causes the detected output power signal ($P_{OUT}$) to be delayed with respect to the desired output power signal ($P_{DESIRED}$). As a result, the power correction may be inaccurate. Another issue with the ramp generation and output power correction circuitry 74' of FIG. 8 is that the integrator 122 must track the trajectory of the composite signal from the output of the multiplier 72 from zero to full-scale. As a result, the response time of the output power correction circuitry 110' may be relatively slow when compared to a ramp-up time of, for example, 8 microseconds and variations in the composite signal due to amplitude modulation during the transmit burst when in 8PSK mode.

Figure 9:
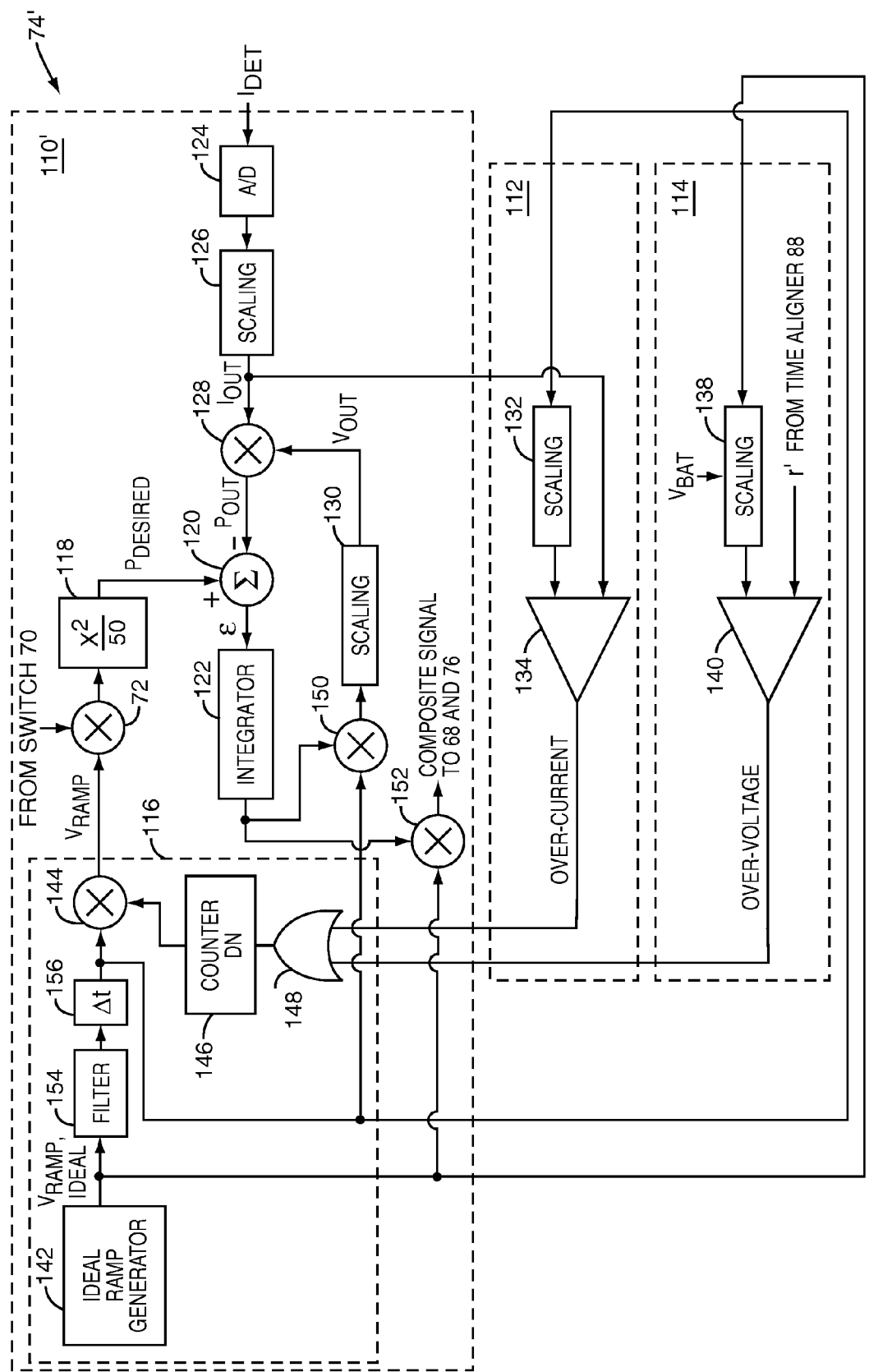
FIG. 9 illustrates the ramp generation and output power correction circuitry of FIG. 8 further including timing circuitry to correct for inherent delays.

FIG. 9 illustrates another embodiment of the ramp generation and output power correction circuitry 74' similar to the embodiment of FIG. 8 that resolves the two issues discussed above. In general, the ramp generation and output power correction circuitry 74' includes the output power correction circuitry 110', the over-current detection and correction circuitry 112, and the over-voltage detection and correction circuitry 114. However, in this embodiment, the output power correction circuitry 110' includes the filter 154 and the delay (Δt) 156. The filter 154 is a low-pass filter matched to the filter 92 (FIG. 7) in order to compensate for the inherent delay of the filter 92. The delay 156 operates to introduce a predetermined delay that compensates for the inherent delays of the D/A converter 90 (FIG. 7), the A/D converter 124, and the power control circuitry 40 (FIG. 1). By doing so, the desired power signal ($P_{DESIRED}$) is time aligned with the detected output power ($P_{OUT}$).

In addition, the output power correction circuitry 110' includes the multipliers 150 and 152. The multiplier 150 operates to multiply the filtered, delayed ideal ramping signal ($V_{RAMP,IDEAL}$) from the output of the delay 156 and the output of the integrator 122 to provide a feedback signal to the scaling circuitry 130. The multiplier 152 operates to multiply the ideal ramping signal ($V_{RAMP,IDEAL}$) and the output of the integrator 122 to provide the corrected composite signal. Note that the multiplier 152 operates based on the ideal ramping signal ($V_{RAMP,IDEAL}$), whereas the multiplier 150 operates based on the filtered, delayed ideal ramping signal ($V_{RAMP,IDEAL}$). This is because it is desirable to time align the output voltage ($V_{OUT}$) with the desired output power signal ($P_{DESIRED}$). As for the multiplier 152, it is not desirable to use the filtered, delayed ideal ramping signal ($V_{RAMP,IDEAL}$) because this would double the latency of the modulator 36 (FIG. 7). This is because the latency of the filter 154 and delay 156 corresponds to the latency of the filter 92 (FIG. 7), D/A converter 90 (FIG. 7), power control circuitry 40 (FIG. 1), and A/D converter 124 which already exist in the path between the composite amplitude signal and the multiplier 128.

As a result of the multipliers 150 and 152, the output of the integrator 122 tracks the error between $V_{RAMP,IDEAL}$ and the value of the composite signal corresponding to the desired output power. In contrast, the integrator 122 of FIG. 8 tracks the trajectory of the composite signal output by the multiplier 72, and must therefore vary from zero to some maximum, or full-scale, value. Accordingly, the response time of the output power correction circuitry 110' of FIG. 9 is substantially decreased with respect to the response time of the embodiment of FIG. 8.

Figure 10:
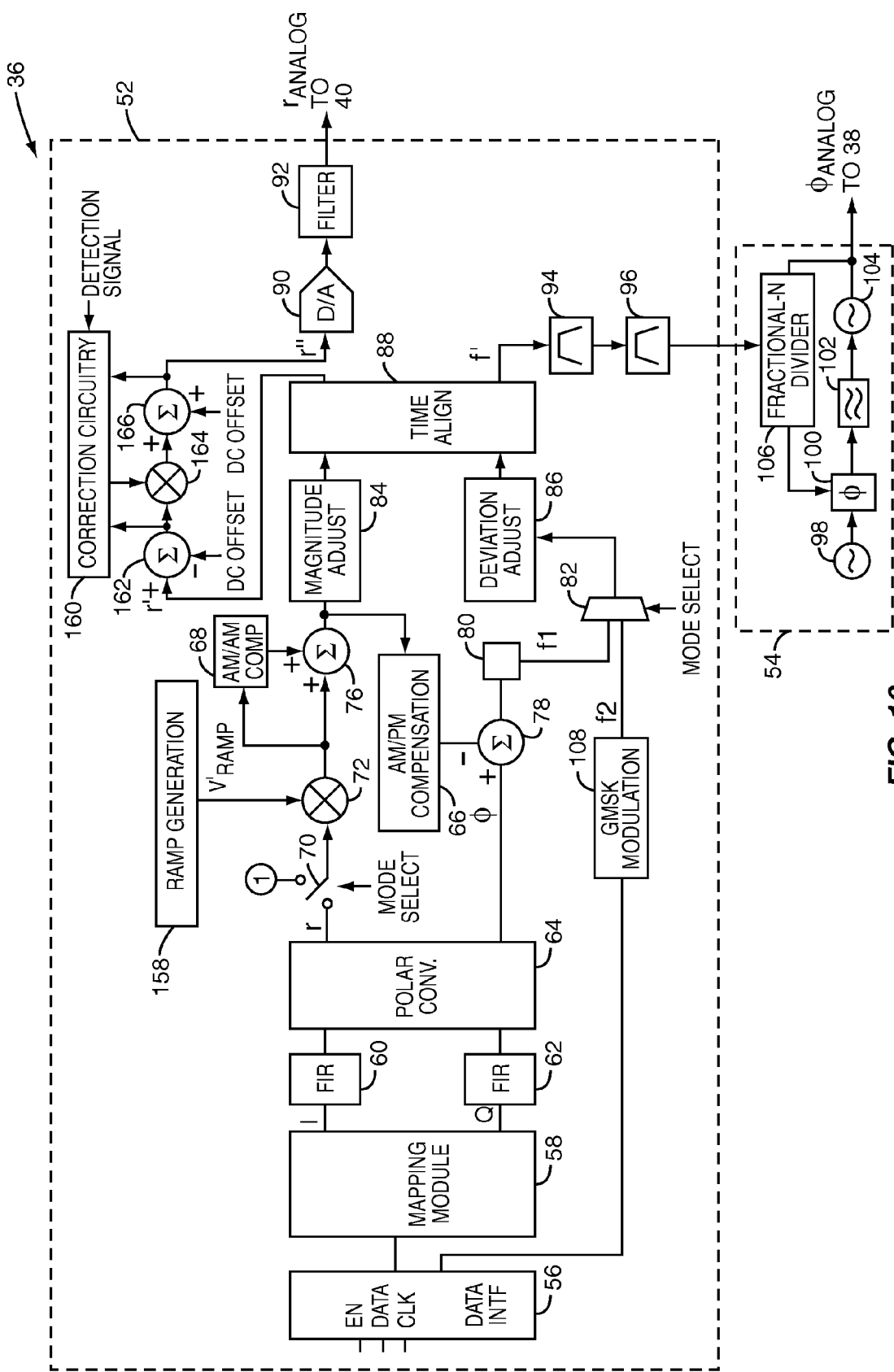
FIG. 10 illustrates another embodiment of the modulator of FIG. 1 according to another embodiment of the present invention.

FIG. 10 illustrates another embodiment of the modulator 36 similar to that shown in FIG. 2. Accordingly, the details of the modulator 36 discussed above with respect to FIG. 2 are equally applicable to the embodiment of FIG. 10. However, FIG. 10 illustrates an alternative embodiment wherein separate ramp generation and correction circuitry are used. More specifically, ramp generation circuitry 158 generates a ramping signal ($V_{RAMP}$), which may be the ideal ramping signal and that defines the transmit burst and optionally an output power level of the mobile terminal 10. The ramping signal ($V_{RAMP}$) is combined with the amplitude modulation component (r) in 8PSK mode and "1" in GMSK mode, as discussed above.

Correction circuitry 160 generally operates to provide a power correction factor that is combined with the amplitude modulation component (r') to provide output power correction including over-current and over-voltage correction. More specifically, a known DC offset is first subtracted, or removed, from the amplitude modulation component (r') by subtraction circuitry 162. Multiplier, or multiplication circuitry, 164 then combines the output of the subtraction circuitry 162 and the power correction factor provided by the correction circuitry 160, and addition circuitry 166 adds the known DC offset back into the amplitude modulation component to provide a corrected amplitude modulation component (r"). The corrected amplitude modulation component, or corrected digital power control signal, is processed by the D/A converter 90 and filtering circuitry 92 to provide a corrected analog amplitude modulation component, which is also referred to as a corrected analog power control signal.

Figure 11:
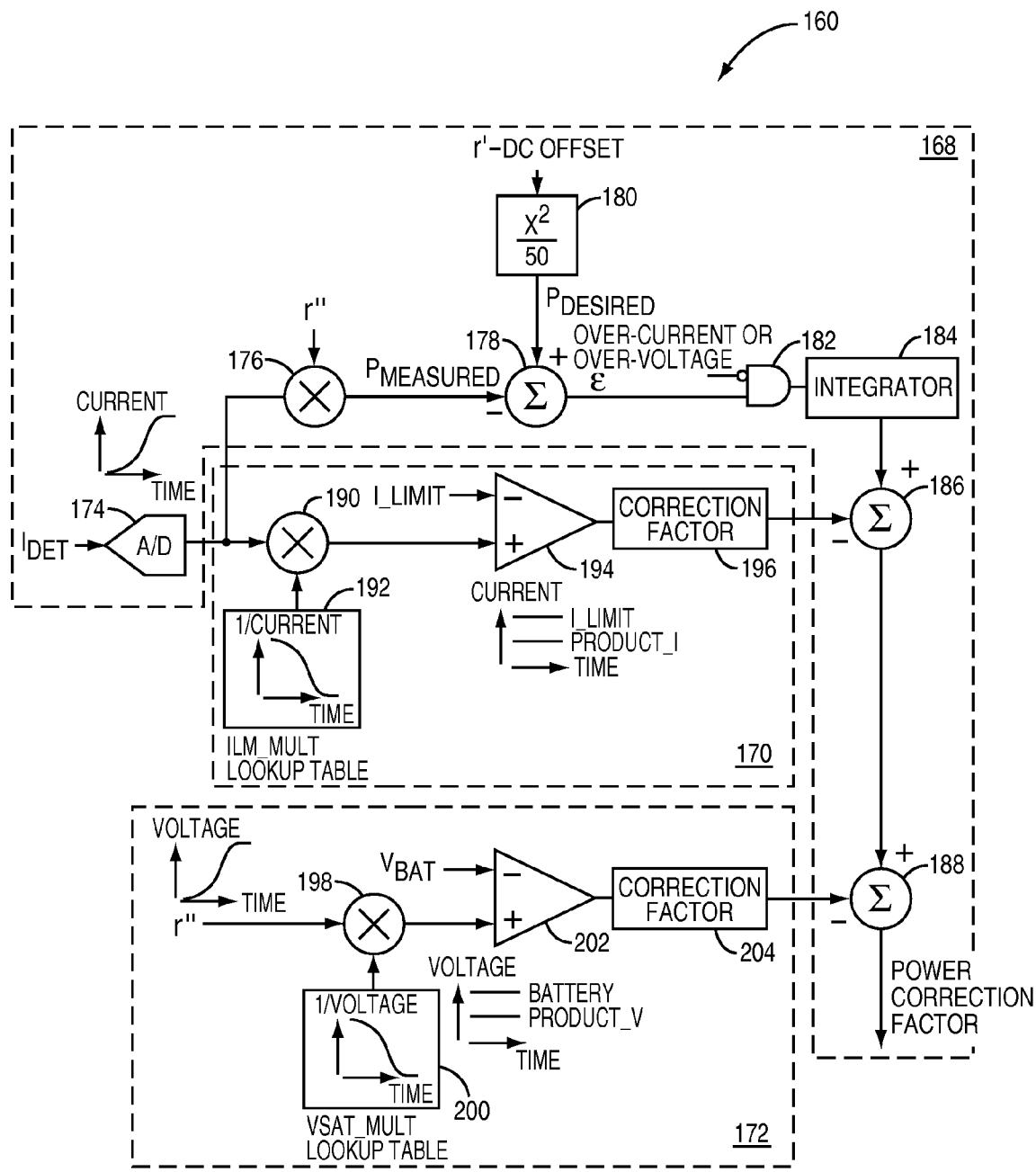
FIG. 11 illustrates one embodiment of the correction circuitry of FIG. 10 according to one embodiment of the present invention.

FIG. 11 is a detailed block diagram of one embodiment of the correction circuitry 160. In general, the correction circuitry 160 includes output power correction circuitry 168, over-current detection and correction circuitry 170, and over-voltage detection and correction circuitry 172. In this embodiment, the detection signal is a current detection signal ($I_{DET}$). With respect to the output power correction circuitry 168, the current detection signal ($I_{DET}$) is digitized by an A/D converter 174. A multiplier 176 multiplies, or combines, the digitized current detection signal and, in this example, the corrected amplitude modulation component (r") to provide a measured power signal ($P_{MEASURED}$) Subtraction circuitry 178 subtracts the measured power signal ($P_{MEASURED}$) from a desired power signal ($P_{DESIRED}$) to provide an error signal (ε). In this embodiment, the desired power signal ($P_{DESIRED}$) is provided by conversion circuitry 180, which operates to convert the output of the subtraction circuitry 162 (FIG. 10) to the desired power signal ($P_{DESIRED}$) based on the equation $X^2/50$ where 50 is the ideal load resistance. Note that the conversion circuitry 180 may alternatively convert, for example, the ramping signal ($V'_{RAMP}$) (FIG. 10) to provide the desired power signal ($P_{DESIRED}$).

Logic gate circuitry 182 operates to provide the error signal (ε) to integrator 184 when neither an over-current nor over-voltage condition is detected. Note that while the logic gate circuitry 182 is illustrated as a single gate for clarity, the logic gate circuitry 182 may include many logic gates in parallel since the error signal (ε) is a digital word including multiple bits. If an over-current or over-voltage condition is detected, the logic gate circuitry 182 outputs a "0." As such, when an over-current or over-voltage condition is detected, the output of the integrator 184 remains constant, thereby enabling the over-current or over-voltage condition to be quickly corrected. The integrator 184 operates to integrate the output of the logic gate circuitry 182 in the manner commonly understood in the art.

Subtraction circuitry 186 operates to subtract an over-current correction factor from the output of the integrator 184. As discussed below, the over-current correction factor is zero when no over-current condition exists. When an over-current condition is detected, the over-current correction factor is increased to correct the over-current condition. Subtraction circuitry 188 operates to subtract an over-voltage correction factor from the output of the subtraction circuitry 186 to provide the power correction factor. As discussed below, the over-voltage correction factor is zero when no over-voltage condition exists. When an over-voltage condition is detected, the over-voltage correction factor is increased to correct the over-voltage condition. The power correction factor from the correction circuitry 160, and more specifically from the subtraction circuitry 188, is provided to the multiplier 164 (FIG. 10).

With respect to the over-current detection and correction circuitry 170, rather than comparing the actual current ramping profile to a maximum current ramping profile as discussed above, the over-current detection and correction circuitry 170 of this embodiment includes a multiplier 190 that multiplies the digitized current detection signal by essentially or substantially an inverse current ramping profile from a look-up table 192 to provide a constant value. Note that the constant value will change if, for example, load conditions at the antenna 16 (FIG. 1) change such that the detected current, or current drained by the power amplifier circuitry 38 (FIG. 1), increases. Also, the look-up table 192 is generated during a calibration process. In general, during calibration, the current drain is determined for a known ramping profile. Based on this information, the inverse of the current ramping profile is determined and scaled such that, for example, the product of the inverse current ramping profile and detected current during ramp-up is essentially equal to a desired value. The desired value may be, for example, a projected full-load current for the transmit burst.

Comparison circuitry 194 compares the constant value, which is also referred to herein as a current product value, to a current limit value. The current limit value is a predetermined value that, for example, is greater than the product of the inverse current ramping profile and ideal or expected current during ramp-up by a desired amount. If the current product value exceeds the current limit value, an over-current condition exists. As a result, an error value corresponding to a difference of the current product value and the current limit value is provided to an over-current correction factor function 196. In one embodiment, the over-current correction factor function 196 provides the over-current correction factor such that it is a predetermined percentage of the error value from the comparison circuitry 194. For example, the predetermined percentage may be 25%. As discussed above, the over-current correction value is then provided to the subtraction circuitry 186 and subtracted from the output of the integrator 184, thereby adjusting the output power of the power amplifier circuitry 38 during ramp-up to correct the over-current condition. Note that one or more iterations may be necessary to correct the over-current condition.

With respect to the over-voltage detection and correction circuitry 172, rather than comparing the actual voltage ramping profile to a maximum voltage ramping profile as discussed above, the over-voltage detection and correction circuitry 172 of this embodiment includes a multiplier 198 that multiplies the corrected amplitude modulation component (r″) from the addition circuitry 166 (FIG. 10) by essentially an inverse voltage ramping profile from a look-up table 200 to provide a constant value. Note that the constant value will change if, for example, load conditions at the antenna 16 (FIG. 1) change such that the output voltage increases. Also, the look-up table 200 is generated during a calibration process. In general, during calibration, the output voltage is determined for a known ramping profile. The inverse of the voltage ramping profile is then determined and scaled such that, for example, the product of the inverse voltage ramping profile and actual voltage during ramp-up is essentially equal to a desired value. The desired value may be, for example, a predetermined amount below the battery voltage ($V_{BAT}$).

Comparison circuitry 202 compares the constant value, which is also referred to herein as a voltage product value, to a voltage limit value. In this embodiment, the voltage limit value is the battery voltage ($V_{BAT}$), or more specifically, a digital representation or measurement of the battery voltage. If the voltage product value exceeds the battery voltage ($V_{BAT}$), an over-voltage condition exists. As a result, an error value corresponding to a difference of the voltage product value and the battery voltage ($V_{BAT}$) is provided to an over-voltage correction factor function 204. In one embodiment, the over-voltage correction factor function 204 provides the over-voltage correction factor such that it is a predetermined percentage of the error value from the comparison circuitry 202. For example, the predetermined percentage may be 50%. As discussed above, the over-voltage correction value is then provided to the subtraction circuitry 188 and subtracted from the output of the subtraction circuitry 186, thereby adjusting the output power of the power amplifier circuitry 38 (FIG. 1) during ramp-up to correct the over-voltage condition. Note that one or more iterations may be necessary to correct the over-voltage condition.

One issue with the over-voltage detection and correction circuitries 114 (FIGS. 3, 6, 8, and 9) and 172 (FIG. 11) is that, due to the internal resistance and capacitive effects of the battery, the battery voltage ($V_{BAT}$) may droop after the end of ramp-up under full-load conditions. As such, the battery voltage ($V_{BAT}$) during the transmit burst may be significantly less than the battery voltage ($V_{BAT}$) prior to ramp-up used for over-voltage detection. As such, the transmit burst or the amplitude modulation in 8PSK mode may be clipped as a result of the drooped battery voltage. In addition, the drooped battery voltage may cause spectral issues with the ramp-down in GMSK mode.

Figure 12:
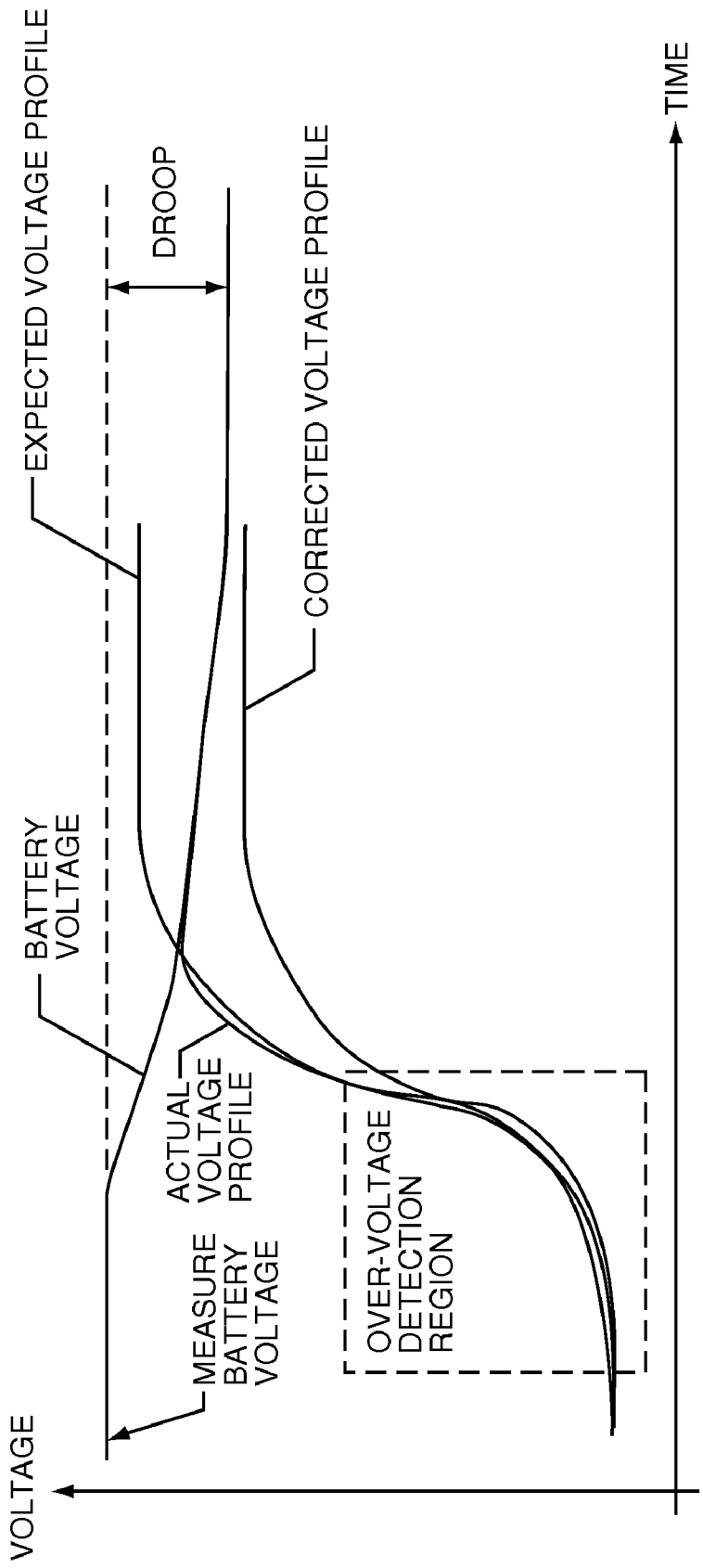
FIG. 12 is a graphical illustration of a scheme compensating for battery droop during over-voltage detection and correction according to one embodiment of the present invention.

Thus, the present invention further provides a system that compensates for the battery droop for over-voltage detection and correction. The general concept is illustrated in FIG. 12. As shown, the battery voltage droops after ramp-up for the transmit burst. As a result, an expected voltage ramping profile is limited or clipped by the drooped battery voltage resulting in an actual voltage ramping profile. According to the present invention, over-voltage detection and correction may further compensate for the droop in the battery voltage, thereby resulting in a corrected voltage ramping profile that has been compensated for the droop in the battery voltage.

Figure 13:
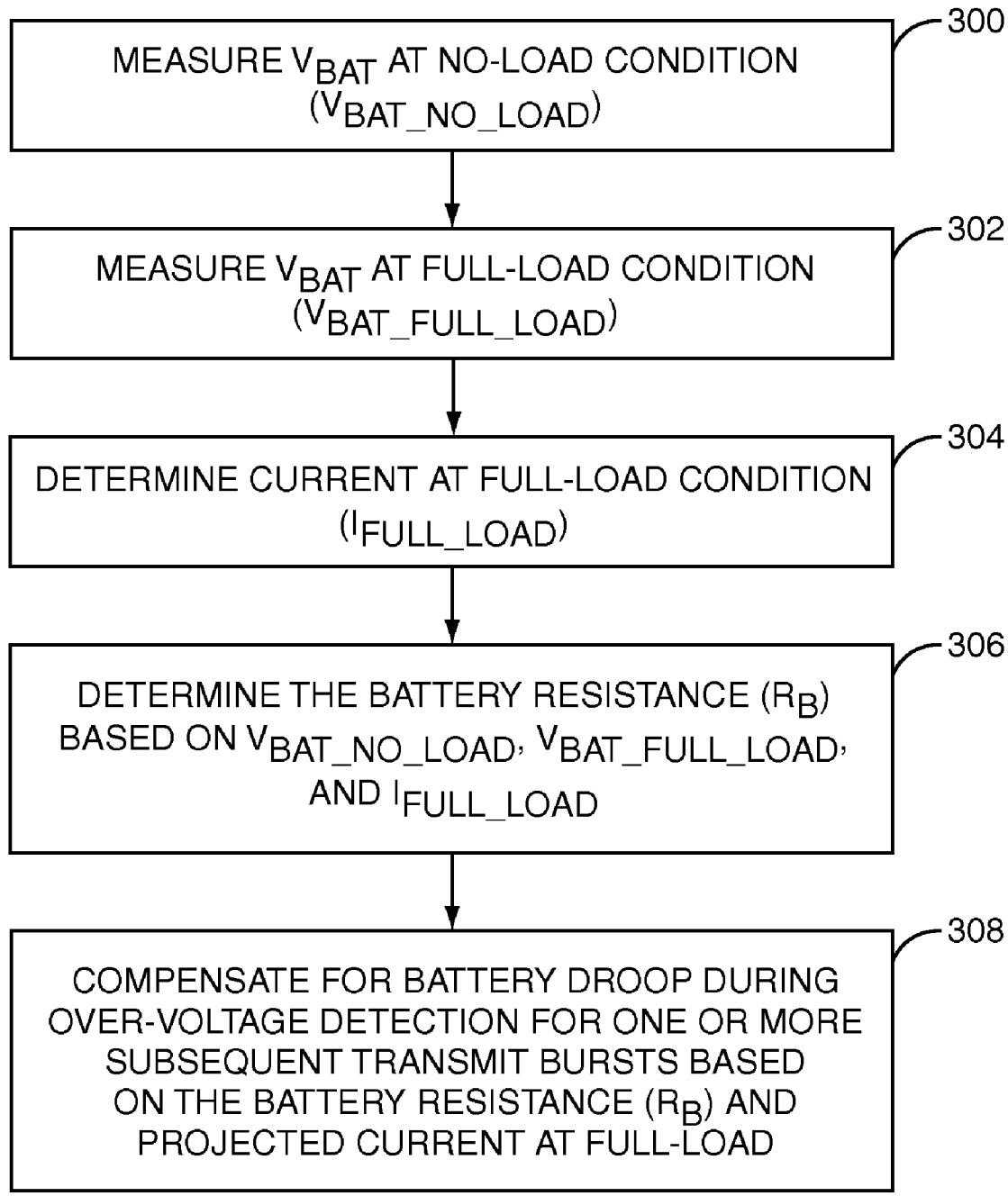
FIG. 13 illustrates a process for compensating for battery droop during over-voltage detection and correction according to one embodiment of the present invention.

FIG. 13 illustrates a process for compensating for battery droop during over-voltage detection and correction according to one embodiment of the present invention. First, the battery voltage ($V_{BAT}$) is measured at no-load condition prior to a first transmit burst to provide a no-load battery voltage ($V_{BAT\_NO\_LOAD}$) (step 300). In one embodiment, the battery voltage ($V_{BAT}$) may be measured by generating a digital representation of the battery voltage ($V_{BAT}$) using, for example, an A/D converter. Next, the battery voltage ($V_{BAT}$) is measured at a full-load condition during the first transmit burst (step 302). The full-load battery voltage ($V_{BAT\_FULL\_LOAD}$) is measured after ramp-up during a period in the transmit burst after the battery voltage has settled and when there is no amplitude modulation. For GMSK mode, the full-load battery voltage ($V_{BAT\_FULL\_LOAD}$) may be measured any time before ramp-down after the battery voltage has been given sufficient time to settle. In 8PSK mode, the full-load battery voltage ($V_{BAT\_FULL\_LOAD}$) is preferably measured at the end of the transmit burst prior to ramp-down during a constant envelope period. More specifically, according to the EDGE standard, the transmit burst has a constant envelope at 2.5 symbol periods after the center of the last transmitted data symbol as a result of the tail symbols. The constant envelope segment lasts for at least two quarter symbol periods before ramp-down begins. As such, the full-load battery voltage ($V_{BAT\_FULL\_LOAD}$) may be measured during the two quarter symbol periods occurring 2.5 symbol periods after the center of the last transmitted data symbol.

In addition, based on the current detection signal ($I_{DET}$), a current at full-load, or the full-load current ($I_{FULL\_LOAD}$), provided to or drained by the power amplifier circuitry 38 (FIG. 1) is measured (step 304). In one embodiment, the full-load current ($I_{FULL\_LOAD}$) is measured at the end of ramp-up. In another embodiment, the full-load current ($I_{FULL\_LOAD}$) may be measured during the same period that the full-load battery voltage ($V_{BAT\_FULL\_LOAD}$) is measured. However, the full-load current ($I_{FULL\_LOAD}$) may be measured at other points during the transmit burst. This is because the battery droop is a result of the capacitive effects of the battery. As such, the current drain, or the current provided to the power amplifier circuitry 38, remains substantially the same.

Next, a battery resistance ($R_B$) is determined or calculated based on the no-load battery voltage ($V_{BAT\_NO\_LOAD}$), the full-load battery voltage ($V_{BAT\_FULL\_LOAD}$), and the full-load current ($I_{FULL\_LOAD}$) (step 306). In this embodiment, the battery resistance ($R_B$) is the resistance of the battery plus the resistance of any or all elements and connections between the battery and the power amplifier circuitry 38 (FIG. 1). More specifically, the battery resistance ($R_B$) may be determined or calculated based on the following equation:

$$R_B = \frac{V_{BAT\_NO\_LOAD} - V_{BAT\_FULL\_LOAD}}{I_{FULL\_LOAD}}.$$

Thereafter, based on the battery resistance ($R_B$), compensation for battery droop is performed for over-voltage detection and correction for one or more subsequent transmit bursts (step 308). More specifically, during ramp-up for a subsequent transmit burst, which may be the next transmit burst, an actual battery voltage ($V_{ACTUAL}$) that accounts for an expected battery droop for the subsequent transmit burst is determined based on the following equation:

$$V_{ACTUAL} = V_{BAT\_NO\_LOAD} - R_B \cdot I_{FULL\_LOAD\_PROJECTED},$$

where ($I_{FULL\_LOAD\_PROJECTED}$) is a projected full-load current for the subsequent transmit burst and $V_{BAT\_NO\_LOAD}$ is a no-load voltage of the battery measured prior to the subsequent transmit burst. The actual battery voltage ($V_{ACTUAL}$), rather than the battery voltage ($V_{BAT}$) or the no-load battery voltage ($V_{BAT\_NO\_LOAD}$), is then used for over-voltage detection and correction.

The projected full-load current ($I_{FULL\_LOAD\_PROJECTED}$) may be determined based on the detected current signal ($I_{DET}$). More specifically, in one embodiment, the projected full-load current ($I_{FULL\_LOAD\_PROJECTED}$) is the product of the detected current signal ($I_{DET}$) and the inverse current profile from the look-up table 192 (FIG. 11). Note that the inverse current profile from the look-up table 192 has a shape that is essentially the inverse of the ideal current ramp-up profile and that is scaled such that the product of the detected current signal ($I_{DET}$) and the inverse current profile is essentially equal to the projected full-load current ($I_{FULL\_LOAD\_PROJECTED}$).

The projected full-load current ($I_{FULL\_LOAD\_PROJECTED}$) may be updated during ramp-up while over-voltage detection and correction is being performed. As such, as corrections are made as a result of over-voltage or over-current conditions, the projected full-load current ($I_{FULL\_LOAD\_PROJECTED}$) and thus the actual battery voltage ($V_{ACTUAL}$) are also updated. This is desirable because as the projected full-load current ($I_{FULL\_LOAD\_PROJECTED}$) changes, the expected or projected battery droop also changes.

This process may be repeated for each transmit burst. Note that the no-load battery voltage ($V_{BAT\_NO\_LOAD}$) may be measured prior to each transmit burst, prior to a first transmit burst after power-up of the mobile terminal 10, or as desired. Further, the battery resistance ($R_B$) may be computed during each transmit burst and used for the subsequent burst or computed periodically and used for multiple subsequent transmit bursts. Further, in one embodiment, the computed battery resistance ($R_B$) may replace the previously computed battery resistance ($R_B$) only if the difference between the full-load battery voltage ($V_{BAT\_FULL\_LOAD}$) and the no-load battery voltage ($V_{BAT\_NO\_LOAD}$) is greater than some predetermined threshold such as, for example, 100 mV.

Before proceeding, it should be noted that the battery resistance ($R_B$) may additionally or alternatively be used as an indicator or "fuel gauge" indicator of remaining battery-life or battery power of the battery of the mobile terminal 10. As such, once determined, the battery resistance ($R_B$) may be provided to the control system 22 (FIG. 1) and used to provide an indication of remaining battery-life or battery power to the user of the mobile terminal 10. Generally, as the battery resistance ($R_B$) increases, the remaining battery power or battery-life decreases. Thus, one or more threshold resistance values may be defined such that the battery resistance ($R_B$) may be compared to the thresholds to provide an indication of remaining battery power or battery-life, where each of the thresholds corresponds to a particular remaining battery-life or battery power level.

Again, the scheme for calculating the battery resistance ($R_B$) and providing the battery resistance ($R_B$) as an indication of battery power or battery-life may be used independently from the output power correction circuits, over-current detection and correction, and over-voltage detection and correction circuits disclosed herein. Thus, in other words, the scheme for calculating the battery resistance ($R_B$) and providing the battery resistance ($R_B$) as an indication of battery power or battery-life may be used in a mobile terminal operating according to a Time Division Multiple Access (TDMA) standard such as the GSM standard, where the mobile terminal may or may not include the output power correction, over-voltage detection and correction, and/or over-current detection and correction circuits disclosed herein.

Figure 14:
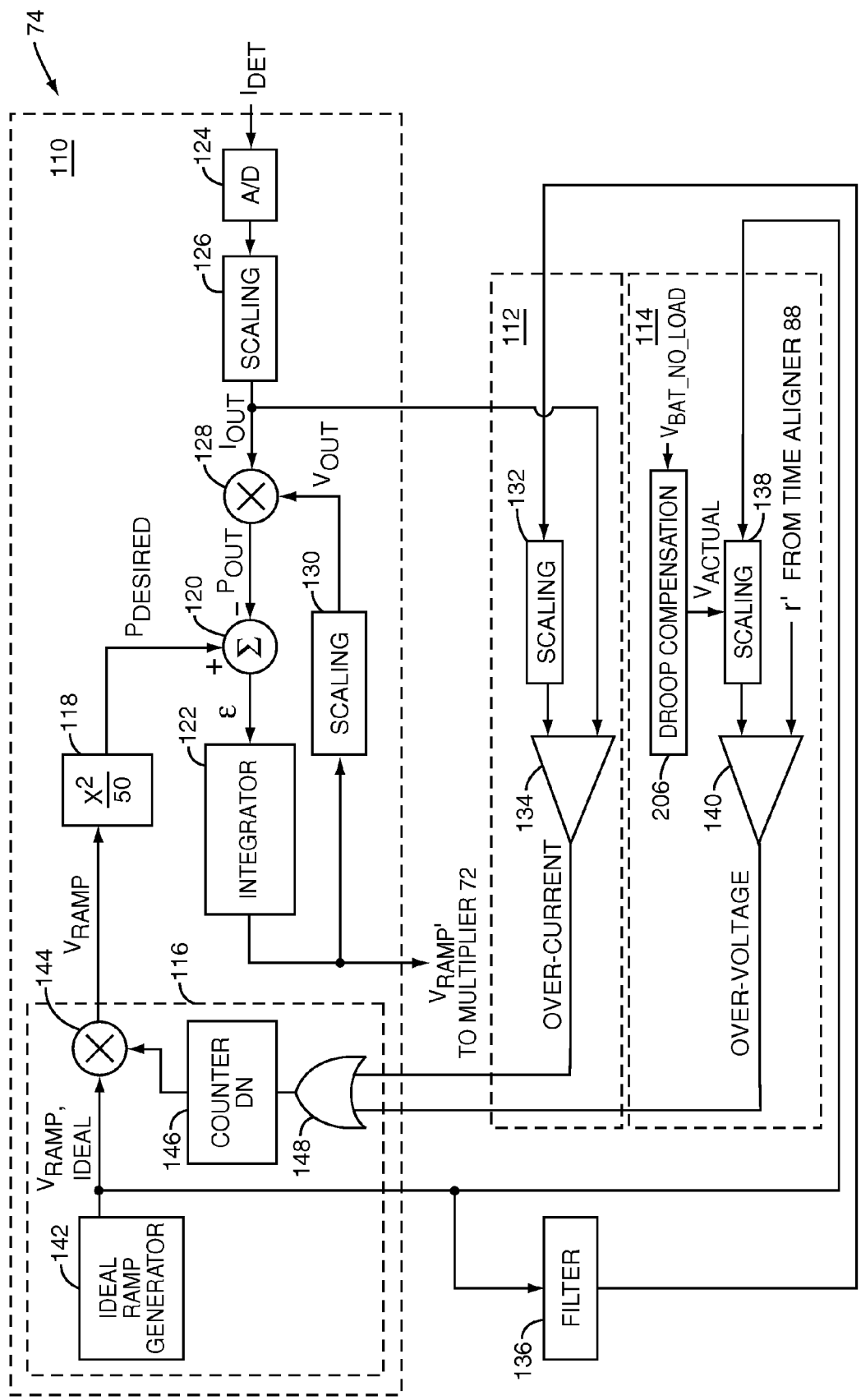
FIG. 14 illustrates another embodiment of the ramp generation and output power correction circuitry of FIG. 3 including droop compensation circuitry according to one embodiment of the present invention.
Figure 15:
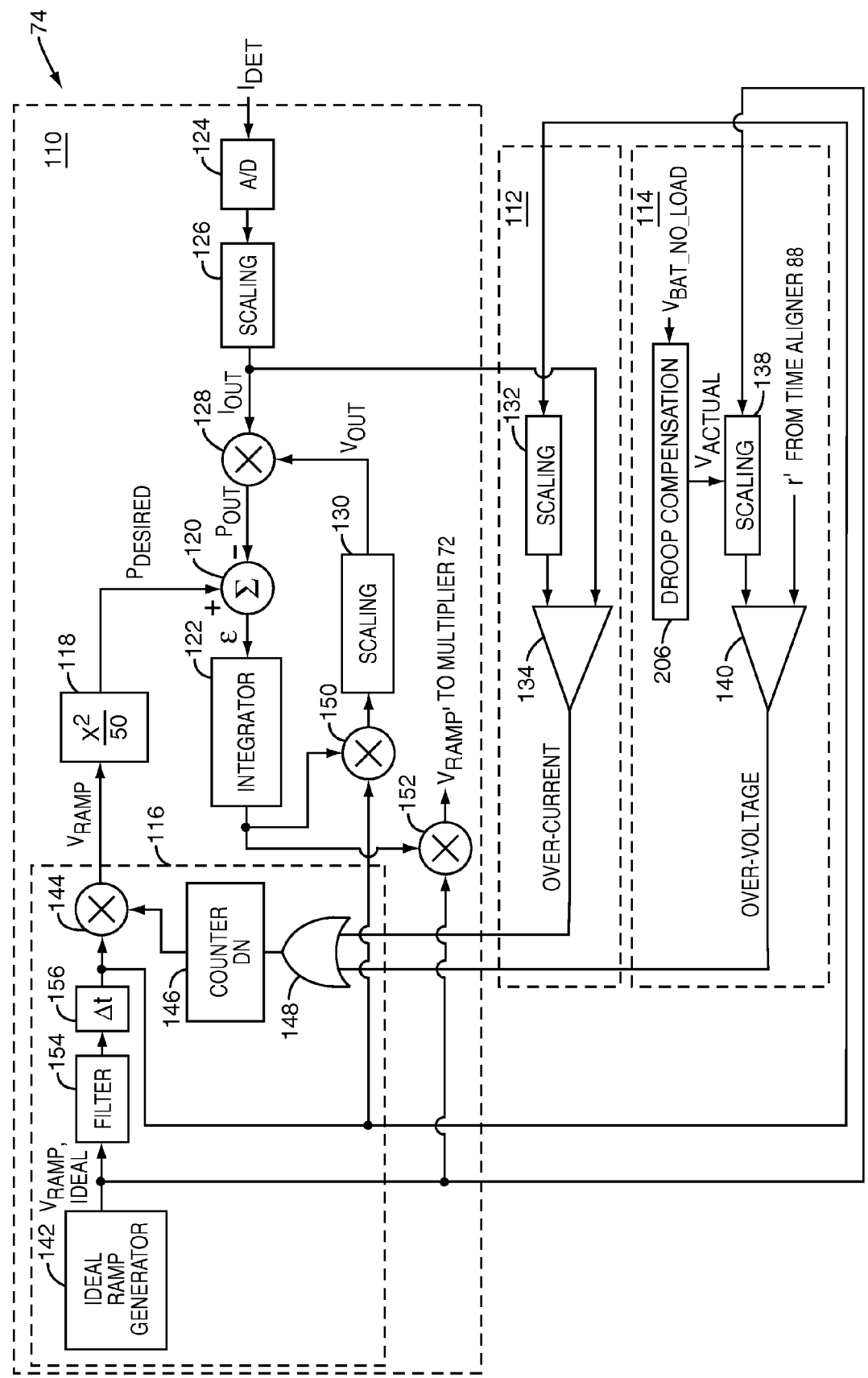
FIG. 15 illustrates another embodiment of the ramp generation and output power correction circuitry of FIG. 6 including droop compensation circuitry according to one embodiment of the present invention.

FIGS. 14 and 15 illustrate second embodiments of the ramp generation and output power correction circuitry 74 of FIGS. 3 and 6, respectively, including droop compensation circuitry 206 according to one embodiment of the present invention. As discussed above, the battery resistance ($R_B$) is first determined or calculated. The battery resistance ($R_B$) may generally be determined or calculated by any available logic or circuitry associated with, and for purposes of this disclosure considered part of, the over-voltage detection and correction circuitry 114 and particularly the droop compensation circuitry 206 such as, for example, a control system of the modulator 36 (FIG. 2), a control system of the ramp generation and output power correction circuitry 74, or the like. Based on the determined or calculated battery resistance ($R_B$) and the projected full-load current ($I_{FULL\_LOAD\_PROJECTED}$), the droop compensation circuitry 206 compensates the battery voltage ($V_{BAT}$) to provide the actual battery voltage ($V_{ACTUAL}$) The over-voltage detection and correction circuitry 114 then proceeds to detect and correct over-voltage conditions during ramp-up in the manner described above.

Figure 16:
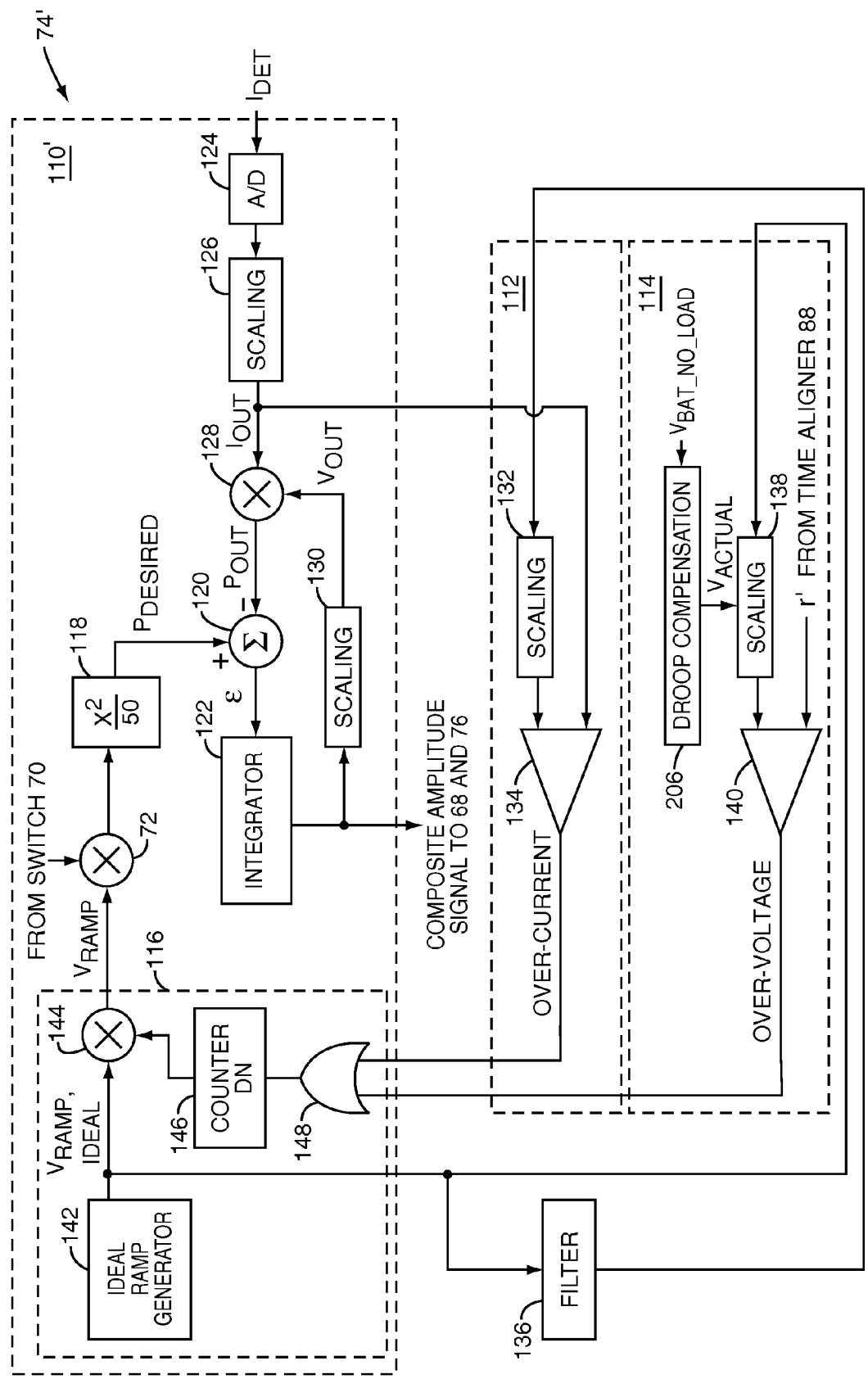
FIG. 16 illustrates another embodiment of the ramp generation and output power correction circuitry of FIG. 8 including droop compensation circuitry according to one embodiment of the present invention.
Figure 17:
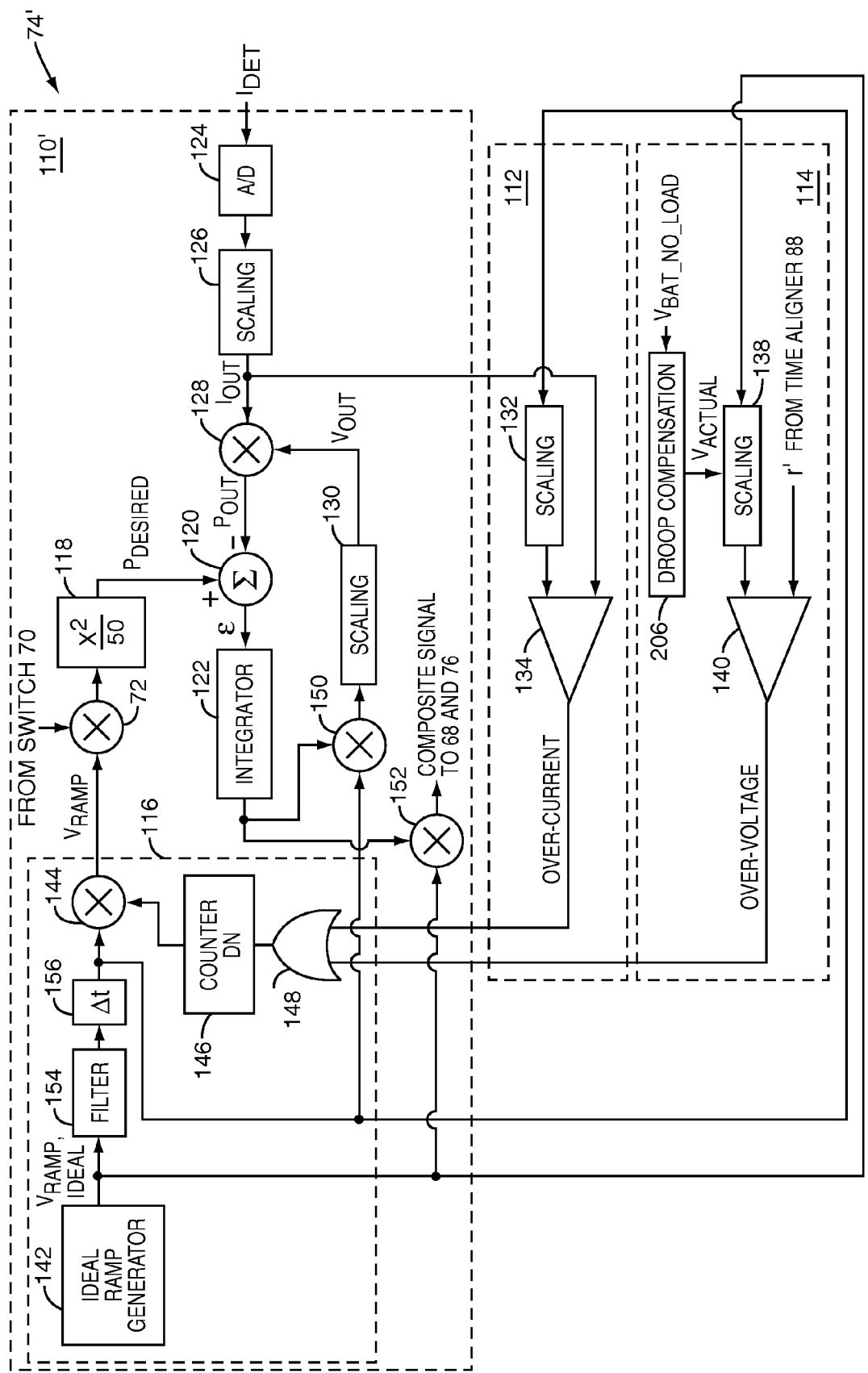
FIG. 17 illustrates another embodiment of the ramp generation and output power correction circuitry of FIG. 9 including droop compensation circuitry according to one embodiment of the present invention.

FIGS. 16 and 17 illustrate second embodiments of the ramp generation and output power correction circuitry 74' of FIGS. 8 and 9, respectively, including the droop compensation circuitry 206 according to one embodiment of the present invention. As discussed above, the battery resistance ($R_B$) is first determined or calculated. The battery resistance ($R_B$) may generally be determined or calculated by any available logic or circuitry associated with, and for purposes of this disclosure considered part of, the over-voltage detection and correction circuitry 114 and particularly the droop compensation circuitry 206 such as, for example, a control system of the modulator 36 (FIG. 7), a control system of the ramp generation and output power correction circuitry 74', or the like. Based on the determined or computed battery resistance ($R_B$) and the projected full-load current ($I_{FULL\_LOAD\_PROJECTED}$), the droop compensation circuitry 206 compensates the battery voltage ($V_{BAT}$) to provide the actual battery voltage ($V_{ACTUAL}$). The over-voltage detection and correction circuitry 114 then proceeds to detect and correct over-voltage conditions during ramp-up in the manner described above.

Figure 18:
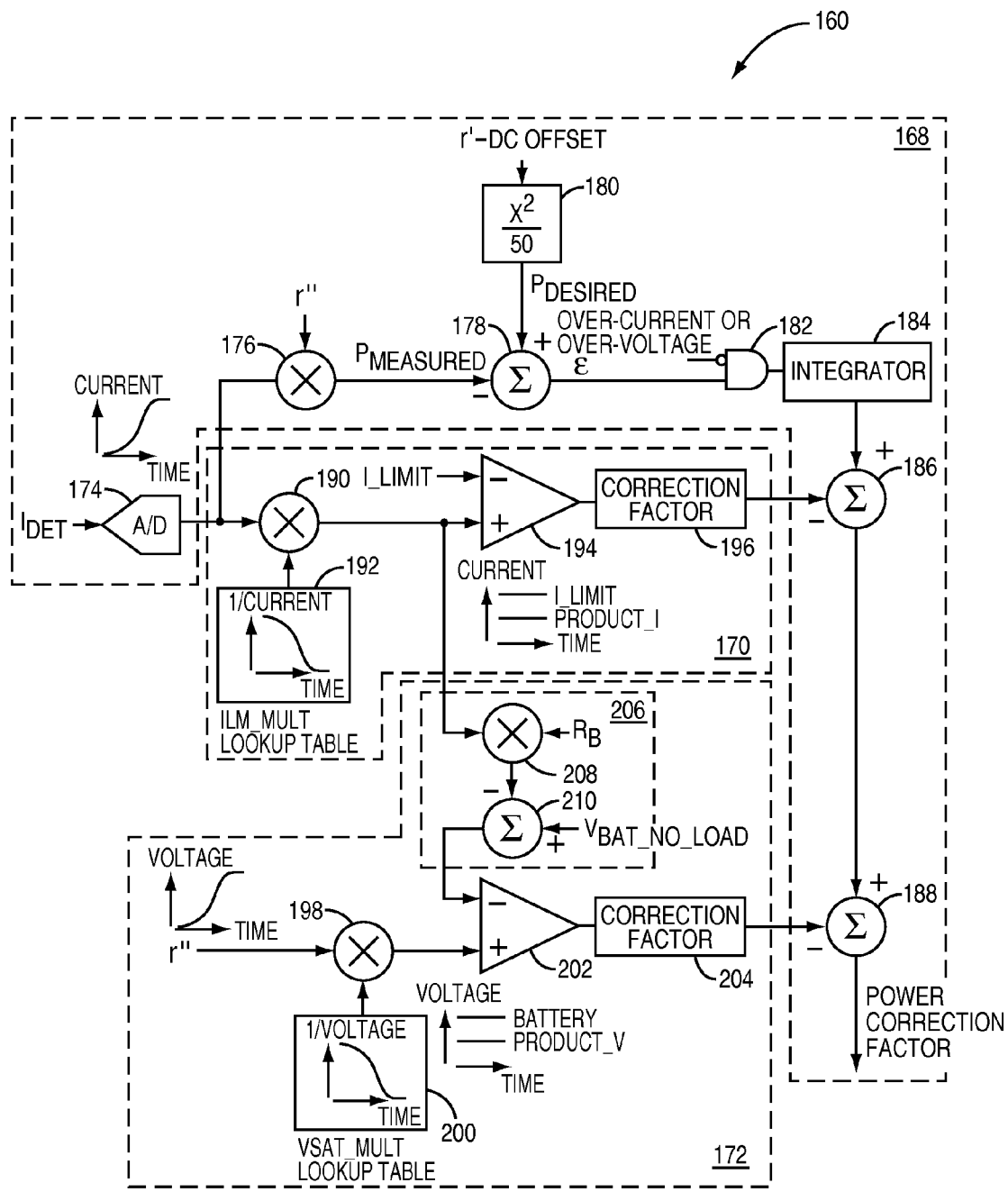
FIG. 18 illustrates another embodiment of the correction circuitry of FIG. 11 including droop compensation circuitry according to one embodiment of the present invention.

FIG. 18 illustrates a second embodiment of the correction circuitry 160 of FIG. 11 including the droop compensation circuitry 206 according to one embodiment of the present invention. As discussed above, the battery resistance ($R_B$) is first determined or calculated. The battery resistance ($R_B$) may generally be determined or calculated by any available logic or circuitry associated with, and for purposes of this disclosure considered part of, the over-voltage detection and correction circuitry 172 and particularly the droop compensation circuitry 206 such as, for example, a control system of the modulator 36 (FIG. 10), a control system of the correction circuitry 160, or the like. Based on the determined or computed battery resistance ($R_B$) and the projected full-load current ($I_{FULL\_LOAD\_PROJECTED}$), the droop compensation circuitry 206 compensates the battery voltage ($V_{BAT}$) to provide the actual battery voltage ($V_{ACTUAL}$). The over-voltage detection and correction system 172 then proceeds to detect and correct over-voltage conditions during ramp-up in the manner described above with respect to FIG. 11.

FIG. 18 also illustrates one embodiment of the droop compensation circuitry 206. In this embodiment, the droop compensation circuitry 206 includes a multiplier 208 and subtraction circuitry 210. In general, the multiplier 208 and the subtraction circuitry 210 are an implementation of the equation given for the actual battery voltage ($V_{ACTUAL}$) given above. In operation, during ramp-up, the multiplier 208 multiplies the current product value, which in this embodiment is the projected full-load current ($I_{FULL\_LOAD\_PROJECTED}$), from the multiplier 190 and the battery resistance ($R_B$) to provide the expected battery droop for the current transmit burst. The output of the multiplier 208 is then subtracted from the no-load battery voltage ($V_{BAT\_NO\_LOAD}$) by subtraction circuitry 210 to provide the actual battery voltage ($V_{ACTUAL}$), where the actual battery voltage ($V_{ACTUAL}$) accounts for the battery droop at full-load conditions. The over-voltage detection and correction system 172 then operates to detect and correct over-voltage conditions during ramp-up based on the actual battery voltage ($V_{ACTUAL}$).

Figure 19:
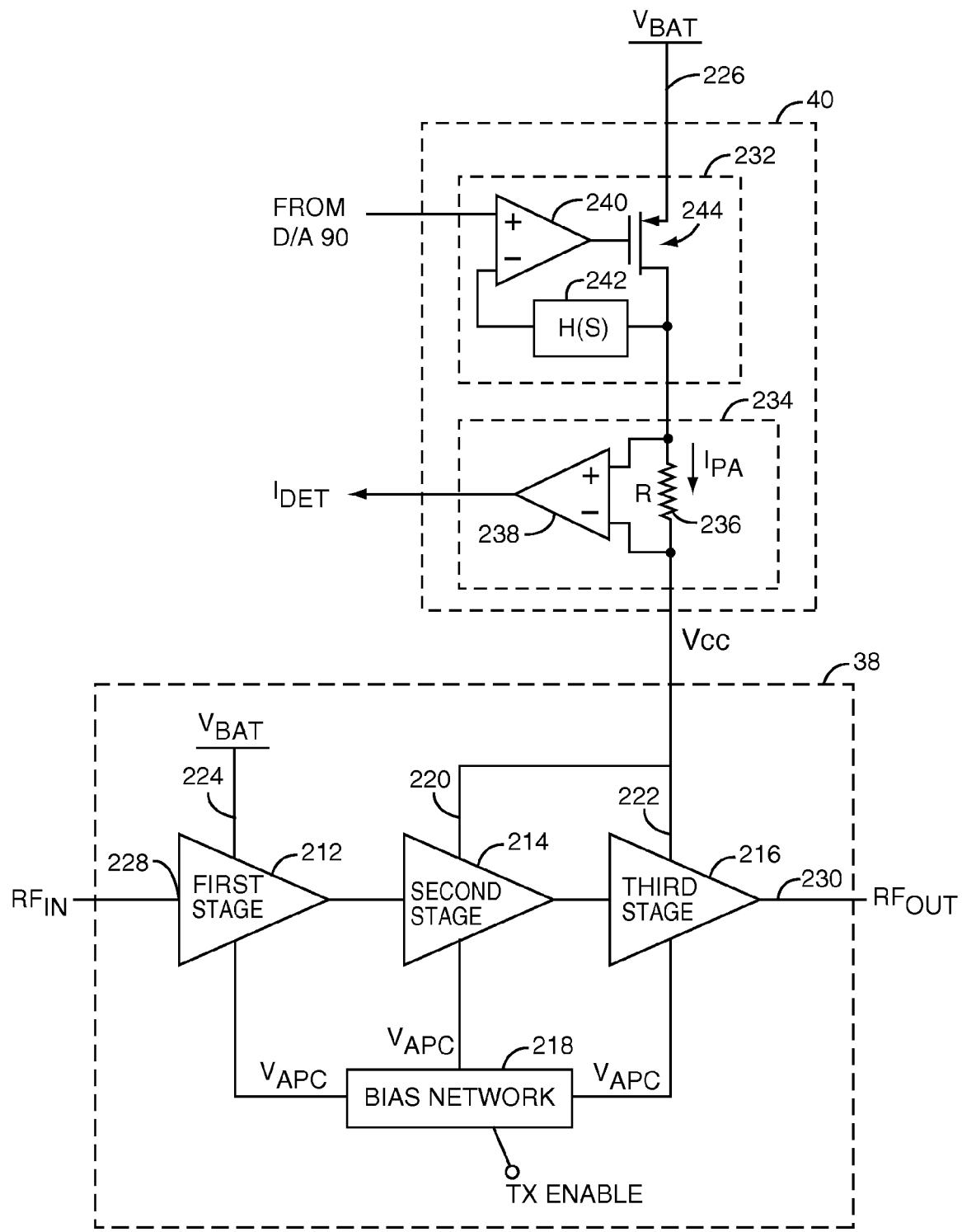
FIG. 19 illustrates a first exemplary embodiment of current detection circuitry for detecting an output current of a power amplifier according to one embodiment of the present invention.
Figure 20:
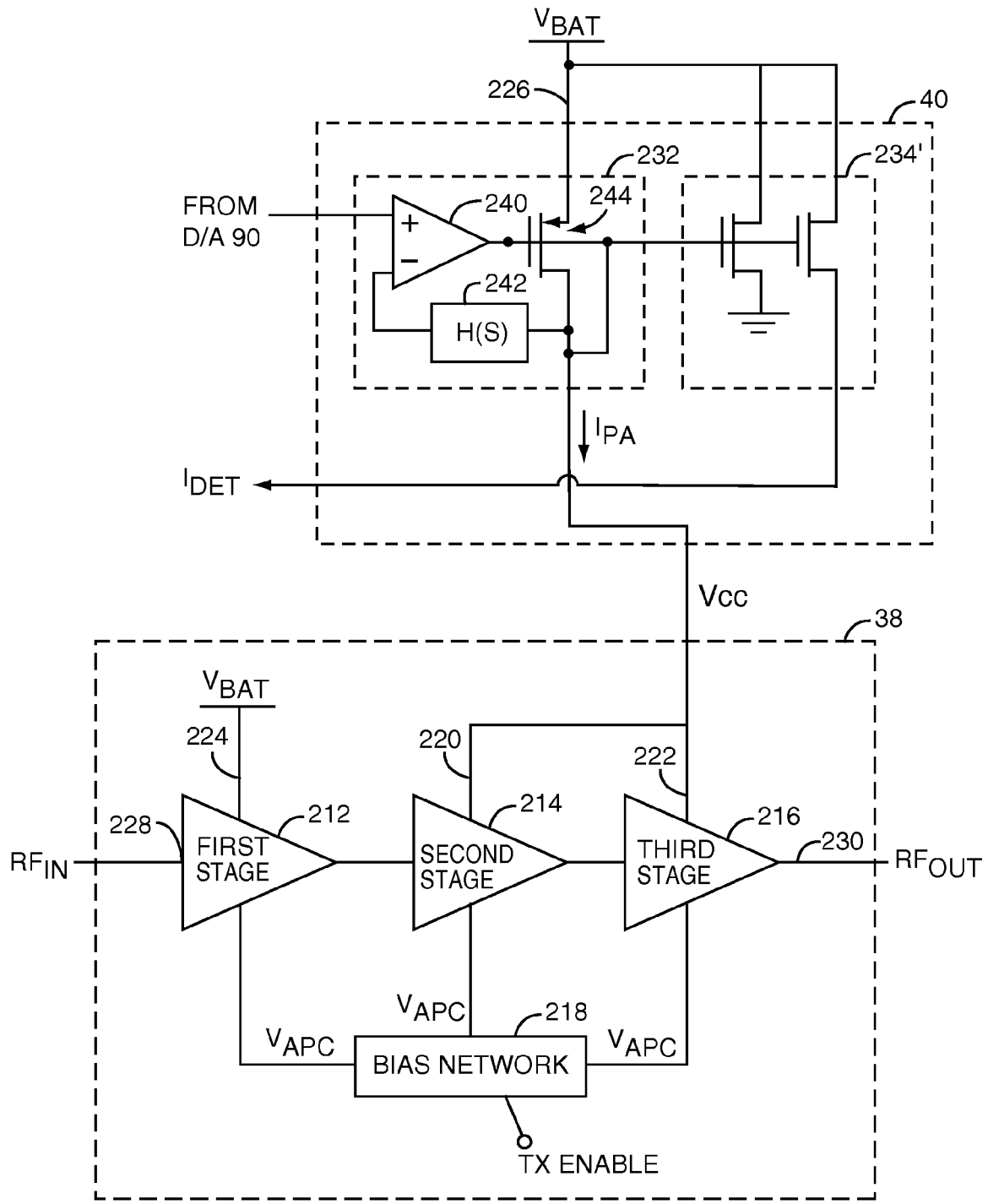
FIG. 20 illustrates a second exemplary embodiment of current detection circuitry for detecting an output current of a power amplifier according to one embodiment of the present invention.

FIGS. 19 and 20 illustrate exemplary embodiments of the power amplifier circuitry 38 and the power control circuitry 40 of FIG. 1, wherein the power control circuitry 40 provides the current detection signal ($I_{DET}$) to the ramp generation and output power correction circuitry 74 or 74' of FIG. 3, 6, 8, 9, 14, 15, 16, or 17 or the correction circuitry 160 of FIG. 11 or 18. Referring to FIG. 19, the power amplifier circuitry 38 is associated with the power control circuitry 40. In one embodiment, the power amplifier circuitry 38 and the power control circuitry 40 are incorporated into a single module. In this exemplary embodiment, the power amplifier circuitry 38 includes three amplifier stages, a first amplifier stage 212, a second amplifier stage 214, and a third amplifier stage 216, as well as a bias network 218 providing bias for each of the three amplifier stages 212, 214, and 216.

The analog power control signal from the D/A converter 90 and filter 92 (FIGS. 2, 7, and 10) is received by the power control circuitry 40 and used as a set-point voltage. Based on the analog power control signal, the power control circuitry 40 controls a supply voltage ($V_{CC}$) provided to the rails 220 and 222 of the second and third amplifier stages 214 and 216, respectively. These rails 220 and 222 will typically be the collectors or drains of bipolar or field effect transistors forming the respective amplifier stages, as will be appreciated by those skilled in the art. It should be noted that, in an alternative embodiment, the supply voltage ($V_{CC}$) may be provided to the rails 224, 220, and 222 of the first, second, and third amplifier stages 212, 214, and 216, respectively. As another alternative, the supply voltage ($V_{CC}$) may be provided to the rails 224 and 220 of the first and second amplifier stages 212 and 214, respectively.

In this embodiment, the rail 224 of the first amplifier stage 212 is connected directly to the battery ($V_{BAT}$), which will preferably also be connected to the terminal for the positive potential of a battery. The battery ($V_{BAT}$) is also preferably connected to an input terminal 226 of the power control circuitry 40. As noted, in one embodiment, the bias network 218 supplies a fixed bias to the three amplifier stages 212, 214, and 216, regardless of the collector/drain supply voltage ($V_{CC}$) provided to the second and third amplifier stages 214 and 216. The fixed bias incorporates traditional $V_{APC}$ signals, which are configured to maintain a constant bias. However, in another embodiment, the bias network 218 provides a constant bias to the first amplifier stage 212 and a variable bias that is reduced when the supply voltage ($V_{CC}$) is reduced to the second and third amplifier stages 214 and 216.

The transmitter control signal (TX ENABLE) is a logic signal used to enable or disable the power amplifier circuitry 38 by removing the bias from each of the three amplifier stages 212, 214, and 216. A radio frequency signal to be amplified ($RF_{IN}$), which is provided by the PLL 54 (FIGS. 2, 7, and 10), is provided at the input 228 of the first amplifier stage 212 and amplified by the three amplifier stages 212, 214, and 216 to provide an amplified output signal ($RF_{OUT}$) at the output 230 of the third amplifier stage 216.

It should be noted that the power control scheme discussed herein provides many benefits. For example, the supply voltage ($V_{CC}$) is preferably provided such that the second and third amplifier stages 214 and 216 operate in saturation. As another example, by providing the fixed battery voltage ($V_{BAT}$) to the first amplifier stage 212, the overall output noise power is not increased when the output power of the power amplifier circuitry 38 is decreased. These benefits, along with the many other benefits of this power control scheme, are discussed in detail in U.S. Pat. No. 6,701,138, entitled POWER AMPLIFIER CONTROL, issued Mar. 2, 2004, which is assigned to RF Micro Devices, Inc. of 7628 Thorndike Road, Greensboro, N.C. 27409 and is hereby incorporated herein by reference in its entirety.

Certain advantages may be realized by forming two or more of the amplifier stages 212, 214, and 216 from a plurality of transistor cells arranged in parallel. For further information pertaining to the transistor arrays, reference is made to U.S. Pat. Nos. 5,608,353, entitled HBT POWER AMPLIFIER, issued Mar. 4, 1997; and 5,629,648, entitled HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. Patent Application Publication No. 2003/0054778, entitled AMPLIFIER POWER DETECTION CIRCUITRY, published Mar. 20, 2003, the disclosure of which is hereby incorporated by reference in its entirety. Exemplary bias networks 218 capable of being used in association with the present invention are described in further detail in U.S. Pat. No. 6,313,705, entitled BIAS NETWORK FOR HIGH EFFICIENCY RF LINEAR AMPLIFIER, issued Nov. 6, 2001, which is also assigned to RF Micro Devices, Inc. and is hereby incorporated by reference in its entirety. Upon understanding the present invention, those skilled in the art will be able to construct any number of bias networks that are compatible with the present invention.

The power control circuitry 40 includes a voltage regulator 232 and current detection circuitry 234. More specifically, the exemplary embodiment of the current detection circuitry 234 includes a resistor 236 and an amplifier 238. The resistor 236 may be a bond wire coupling an output terminal of the power control circuitry 40 to an input terminal of the power amplifier circuitry 38. However, the resistor 236 may be any resistive element coupling the voltage regulator 232 to the power amplifier circuitry 38. The amplifier 238 operates to provide the current detection signal ($I_{DET}$) indicative of the actual current ($I_{PA}$) based on a voltage differential across the resistor 236.

FIG. 19 also illustrates an exemplary embodiment of the voltage regulator 232 previously disclosed in U.S. Pat. No. 6,701,138, which has been incorporated herein by reference in its entirety, wherein the voltage regulator 232 is a Low Dropout (LDO) voltage regulator. For a detailed discussion of the LDO voltage regulator, see U.S. Pat. No. 6,701,138. In general, the voltage regulator 232 includes an error amplifier 240, a feedback network 242, and a series pass element 244. In this embodiment, the series pass element 244 is a p-FET. The analog power control signal may be received by a positive input (+) of an operational amplifier forming the error amplifier 240. The output of the series pass element 244 is fed back through the feedback network 242 and received by a negative input (−) of the error amplifier 240. An output signal from the error amplifier 240 is provided to a control input of the series pass element 244 that controls the regulated output of the voltage regulator 232.

In an alternative embodiment, the voltage regulator 232 may be a switching DC/DC converter, as described in commonly owned and assigned U.S. Pat. No. 7,132,891, entitled POWER AMPLIFIER CONTROL USING A SWITCHING POWER SUPPLY, issued Nov. 7, 2006, which is hereby incorporated herein by reference in its entirety. In another alternative embodiment, the voltage regulator 232 may be configurable as either an LDO voltage regulator or a switching DC/DC converter, as described in commonly owned and assigned U.S. Pat. No. 7,167,054, entitled RECONFIGURABLE POWER CONTROL FOR A MOBILE TERMINAL, issued Jan. 23, 2007, which is hereby incorporated herein by reference in its entirety.

FIG. 20 illustrates another embodiment of the power control circuitry 40 of the present invention. This embodiment is substantially the same as the embodiment of FIG. 19. However, in this embodiment, the current detection circuitry 234 is a current mirror 234'. The operation of the current mirror 234' will be apparent to one of ordinary skill in the art upon reading this disclosure. In general, the current mirror 234' generates the current detection signal ($I_{DET}$) based on the actual current ($I_{PA}$) through the series pass element 244 of the voltage regulator 232. The current mirror 234' provides the additional advantage of not adding a voltage drop, such as the voltage drop across the resistor 236 of FIG. 19, and is easily implemented in Complimentary Metal-Oxide-Semiconductor (CMOS) technology.

FIG. 21 illustrates another embodiment of the power amplifier circuitry 38 and the power control circuitry 40, where both a power detection signal ($P_{DET}$) and the current detection signal ($I_{DET}$) are provided to the ramp generation and output power correction circuitry 74 or 74' (FIGS. 3, 6, 8, 9, 14, 15, 16, and 17) or the correction circuitry 160 (FIGS. 11 and 18). More specifically, the power detection signal ($P_{DET}$) is provided to the output power correction circuitry 110, 110' or 168 from a directional coupler 246. The details of the directional coupler 246 will be apparent to one of ordinary skill in the art upon reading this disclosure. Note that because the power detection signal ($P_{DET}$) is indicative of the output power, the multiplier 128 and scaling circuitry 130 (FIGS. 3, 6, 8, 9, 14, 15, 16, and 17) or the multiplier 176 (FIGS. 11 and 18) are not needed because the power detection signal ($P_{DET}$) does not need to be converted from current to power. However, the scaling circuitry may be needed depending on the particular design of the directional coupler 246. As discussed above, the current detection signal ($I_{DET}$) is provided to the over-current detection and correction circuitry 112 or 170.

FIGS. 19-21 are exemplary embodiments illustrating how the detection signal (DETECTION SIGNAL) is generated and are not intended to limit the scope of the present invention. Various alternatives for generating the detection signal (DETECTION SIGNAL) as either a current or power detection signal will be apparent to one of ordinary skill in the art upon reading this disclosure.

The present invention provides substantial opportunity for variation without departing from the spirit or scope of the present invention. For example, each of the various embodiments of the present invention illustrated and discussed herein include output power correction circuitry 110, 110', or 168; over-current detection and correction circuitry 112 or 170; and over-voltage detection and correction circuitry 114 or 172. However, alternative embodiments of the present invention may include one or more of the output power correction circuitry 110, 110', or 168; over-current detection and correction circuitry 112 or 170; and over-voltage detection and correction circuitry 114 or 172.

Those skilled in the art will recognize improvements and modifications to the preferred embodiments of the present invention. All such improvements and modifications are considered within the scope of the concepts disclosed herein and the claims that follow.

What is claimed is:

1. A transmit system for a mobile terminal comprising:
   a) over-current detection and correction circuitry adapted to:
      i) combine a current detection signal indicative of an output current of power amplifier circuitry in the transmit system during ramp-up for a transmit burst and a substantially inverse current ramping profile to provide a first constant value;
      ii) compare the first constant value to a current threshold value to determine whether an over-current condition exists; and
      iii) if an over-current condition exists, reduce an output power of the power amplifier circuitry during ramp-up for the transmit burst to correct for the over-current condition.

2. The transmit system of claim 1 wherein the over-current detection and correction circuitry is further adapted to combine the current detection signal and the substantially inverse current ramping profile to provide the first constant value, compare the first constant value to the current threshold value to determine whether an over-current condition exists, and reduce the output power of the power amplifier circuitry if an over-current condition exists at multiple points during ramp-up for the transmit burst.

3. The transmit system of claim 1 wherein the over-current detection and correction circuitry is further adapted to multiply the current detection signal and the substantially inverse current ramping profile to provide the first constant value.

4. The transmit system of claim 1 wherein the over-current condition exists if the first constant value is greater than the current threshold value.

5. The transmit system of claim 1 wherein in order to reduce the output power, the over-current detection and correction circuitry is further adapted to adjust a power control signal to reduce the output power of the power amplifier circuitry during ramp-up for the transmit burst, the power control signal controlling a supply voltage provided to the power amplifier circuitry.

6. The transmit system of claim 5 further comprising:
   modulation circuitry adapted to combine a ramping signal defining the transmit burst, an amplitude modulation component, and a power correction factor to provide the power control signal;
   wherein in order to reduce the output power of the power amplifier circuitry if an over-current condition exists, the over-current detection and correction circuitry is further adapted to reduce the power correction factor, thereby reducing the power control signal and the output power of the power amplifier circuitry to correct for the over-current condition.

7. The transmit system of claim 5 further comprising:
   modulation circuitry adapted to:
      combine a ramping signal defining the transmit burst, an amplitude modulation component, and a power correction factor to provide the power control signal; and
      provide a radio frequency signal including a phase modulation component at a desired radio frequency;
   power control circuitry adapted to provide a variable supply voltage to the power amplifier circuitry based on the power control signal;
   the power amplifier circuitry adapted to amplify the radio frequency signal based on the variable supply voltage; and
   current detection circuitry adapted to provide the current detection signal indicative of the output current of the power amplifier circuitry;
   wherein in order to reduce the output power of the power amplifier circuitry if an over-current condition exists, the over-current detection and correction circuitry is further adapted to reduce the power correction factor, thereby reducing the power control signal and the output power of the power amplifier circuitry to correct for the over-current condition.

8. The transmit system of claim 1 further comprising over-voltage detection and correction circuitry adapted to:
   combine a signal indicative of a supply voltage provided to the power amplifier circuitry in the transmit system during ramp-up for the transmit burst and a substantially inverse voltage ramping profile to provide a second constant value;
   compare the second constant value to a voltage threshold value to determine whether an over-voltage condition exists; and
   if an over-voltage condition exists, reduce the output power of the power amplifier circuitry during ramp-up for the transmit burst to correct for the over-voltage condition.

9. A transmit system for a mobile terminal comprising:
   a) over-voltage detection and correction circuitry adapted to:
      i) combine a signal indicative of a supply voltage provided to power amplifier circuitry in the transmit system during ramp-up for a transmit burst and a substantially inverse voltage ramping profile to provide a first constant value;
      ii) compare the first constant value to a voltage threshold value to determine whether an over-voltage condition exists; and
      iii) if an over-voltage condition exists, reduce an output power of the power amplifier circuitry during ramp-up for the transmit burst to correct for the over-voltage condition.

10. The transmit system of claim 9 wherein the over-voltage detection and correction circuitry is further adapted to combine the signal indicative of the supply voltage and the substantially inverse voltage ramping profile to provide the first constant value, compare the first constant value to the voltage threshold value to determine whether an over-voltage condition exists, and reduce the output power of the power amplifier circuitry if an over-voltage condition exists at multiple points during ramp-up for the transmit burst.

11. The transmit system of claim 9 wherein the over-voltage detection and correction circuitry is further adapted to multiply the signal indicative of the supply voltage and the substantially inverse voltage ramping profile to provide the first constant value.

12. The transmit system of claim 9 wherein the over-voltage condition exists if the first constant value is greater than the voltage threshold value.

13. The transmit system of claim 9 wherein in order to reduce the output power, the over-voltage detection and correction circuitry is further adapted to adjust a power control signal to reduce the output power of the power amplifier circuitry during ramp-up for the transmit burst, the power control signal controlling the supply voltage provided to the power amplifier circuitry.

14. The transmit system of claim 13 further comprising:
   modulation circuitry adapted to combine a ramping signal defining the transmit burst, an amplitude modulation component, and a power correction factor to provide the power control signal;
   wherein in order to reduce the output power of the power amplifier circuitry if an over-voltage condition exists, the over-voltage detection and correction circuitry is further adapted to reduce the power correction factor, thereby reducing the power control signal and the output power of the power amplifier circuitry to correct for the over-voltage condition.

15. The transmit system of claim 13 further comprising:
modulation circuitry adapted to:
  combine a ramping signal defining the transmit burst, an amplitude modulation component, and a power correction factor to provide the power control signal; and
  provide a radio frequency signal including a phase modulation component at a desired radio frequency;
power control circuitry adapted to provide a variable supply voltage to the power amplifier circuitry based on the power control signal; and
the power amplifier circuitry adapted to amplify the radio frequency signal based on the variable supply voltage;
wherein in order to reduce the output power of the power amplifier circuitry if an over-voltage condition exists, the over-voltage detection and correction circuitry is further adapted to reduce the power correction factor, thereby reducing the power control signal and the output power of the power amplifier circuitry to correct for the over-voltage condition.

16. The transmit system of claim 9 wherein the voltage threshold value is an actual battery voltage that is adjusted to compensate for an expected voltage droop of a battery of the mobile terminal during the transmit burst, and, in order to provide the actual battery voltage, the transmit system further comprises a battery droop compensation function adapted to:
  measure a battery voltage of the battery of the mobile terminal at a no-load condition prior to a previous transmit burst to provide a no-load battery voltage;
  measure the battery voltage of the battery at a full-load condition during the previous transmit burst to provide a full-load battery voltage;
  measure a current provided from the battery to the power amplifier circuitry at a full-load condition during the previous transmit burst to provide a full-load current;
  determine a battery resistance based on the no-load battery voltage, the full-load battery voltage, and the full-load current; and
  provide the actual battery voltage for the transmit burst that is compensated for the expected voltage droop of the battery for the transmit burst based on the battery resistance.

17. The transmit system of claim 16 wherein the battery droop compensation function is further adapted to determine the battery resistance based on the equation:

$$R_B = \frac{V_{BAT\_NO\_LOAD} - V_{BAT\_FULL\_LOAD}}{I_{FULL\_LOAD}},$$

wherein $R_B$ is the battery resistance, $V_{BAT\_NO\_LOAD}$ is the no-load battery voltage, $V_{BAT\_FULL\_LOAD}$ is the full-load battery voltage, and $I_{FULL\_LOAD}$ is the full-load current.

18. The transmit system of claim 16 wherein in order to provide the actual battery voltage, the battery droop compensation function is further adapted to:
  determine a projected full-load current to be provided from the battery to the power amplifier circuitry during the transmit burst;
  provide the expected voltage droop of the battery for the transmit burst based on the projected full-load current and the battery resistance; and
  generate the actual battery voltage for the transmit burst based on the expected voltage droop of the battery for the transmit burst.

19. The transmit system of claim 18 wherein the battery droop compensation function is further adapted to multiply the projected full-load current and the battery resistance to provide the expected voltage droop of the battery for the transmit burst.

20. The transmit system of claim 18 wherein the battery droop compensation function is further adapted to subtract the expected voltage droop of the battery for the transmit burst from a no-load battery voltage measured prior to ramp-up for the transmit burst to generate the actual battery voltage.

21. The transmit system of claim 18 further comprising:
  updating the projected full-load current for the transmit burst during ramp-up for the transmit burst;
  updating the expected voltage droop of the battery for the transmit burst based on the updated projected full-load current and the battery resistance; and
  updating the actual battery voltage for the transmit burst based on the updated expected voltage droop of the battery for the transmit burst.

22. The transmit system of claim 16 wherein the battery resistance is a resistance of the battery plus a resistance of any elements connected between the battery and the power amplifier circuitry.

23. The transmit system of claim 9 further comprising over-current detection and correction circuitry adapted to:
  combine a current detection signal indicative of an output current of the power amplifier circuitry during ramp-up for the transmit burst and a substantially inverse current ramping profile to provide a second constant value;
  compare the second constant value to a current threshold value to determine whether an over-current condition exists; and
  if an over-current condition exists, reduce the output power of the power amplifier circuitry during ramp-up for the transmit burst to correct for the over-current condition.

24. A transmit system for a mobile terminal comprising:
  a) over-current detection and correction circuitry adapted to:
    i) combine a current detection signal indicative of an output current of power amplifier circuitry in the transmit system during ramp-up for a transmit burst and a substantially inverse current ramping profile to provide a first constant value;
    ii) compare the first constant value to a current threshold value to determine whether an over-current condition exists; and
    iii) if an over-current condition exists, reduce an output power of the power amplifier circuitry during ramp-up for the transmit burst to correct for the over-current condition; and
  b) over-voltage detection and correction circuitry adapted to:
    i) combine a signal indicative of a supply voltage provided to the power amplifier circuitry in the transmit system during ramp-up for the transmit burst and a substantially inverse voltage ramping profile to provide a second constant value;
    ii) compare the second constant value to a voltage threshold value to determine whether an over-voltage condition exists; and
    iii) if an over-voltage condition exists, reduce the output power of the power amplifier circuitry during ramp-up for the transmit burst to correct for the over-voltage condition.

* * * * *